(12) United States Patent
Morimoto et al.

(10) Patent No.: US 7,887,877 B2
(45) Date of Patent: Feb. 15, 2011

(54) MANUFACTURING EQUIPMENT OF DISPLAY DEVICE AND MANUFACTURING METHOD OF DISPLAY DEVICE

(75) Inventors: Kazunori Morimoto, Fussa (JP); Tomoyuki Shirasaki, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 1057 days.

(21) Appl. No.: 11/644,371

(22) Filed: Dec. 21, 2006

(65) Prior Publication Data

US 2007/0160772 A1   Jul. 12, 2007

(30) Foreign Application Priority Data

Dec. 22, 2005   (JP)   ............... 2005-370617

(51) Int. Cl.
*B05D 5/06* (2006.01)
*B05D 3/02* (2006.01)
*B05D 3/06* (2006.01)

(52) U.S. Cl. ............ 427/66; 427/256; 427/372.2; 427/557

(58) Field of Classification Search .......... 427/66, 427/372.2, 557, 256
See application file for complete search history.

(56) References Cited

U.S. PATENT DOCUMENTS

| | | | | |
|---|---|---|---|---|
| 2002/0067400 A1* | 6/2002 | Kawase et al. | ............ | 347/101 |
| 2004/0226929 A1 | 11/2004 | Miura et al. | | |
| 2004/0255848 A1 | 12/2004 | Yudasaka | | |
| 2005/0068396 A1 | 3/2005 | Ferran et al. | | |
| 2005/0100660 A1* | 5/2005 | Ito et al. | ............ | 427/66 |
| 2007/0052787 A1 | 3/2007 | Miura et al. | | |

FOREIGN PATENT DOCUMENTS

| | | |
|---|---|---|
| CN | 1532054 A | 9/2004 |
| JP | 2001-076881 A | 3/2001 |
| JP | 2003-142261 A | 5/2003 |
| JP | 2003-217842 A | 7/2003 |
| JP | 2004-145244 A | 5/2004 |
| JP | 2004-165140 A | 6/2004 |
| TW | I239271 | 9/2005 |

OTHER PUBLICATIONS

Taiwanese Office Action dated Jan. 12, 2010 and English translation thereof issued in a counterpart Taiwanese Application No. 095149432.
Chinese Office Action dated Feb. 6, 2009 (6 pages), and English translation thereof (5 pages) issued in counterpart Chinese Application No. 2006101701451.
Japanese Office Action (and English translation thereof) dated Oct. 10, 2008, issued in a counterpart Japanese Application.

* cited by examiner

*Primary Examiner*—Timothy H Meeks
*Assistant Examiner*—James Lin
(74) *Attorney, Agent, or Firm*—Holtz, Holtz, Goodman & Chick, PC

(57) ABSTRACT

At a first timing, an ink jetting unit of a printer head coats an aqueous ink or an organic solvent ink on pixel forming regions on a panel substrate. At a second timing, a first infrared light source unit or a second infrared light source unit disposed adjacently to the ink jetting unit radiates infrared light to the aqueous ink or the organic solvent ink coated on the pixel forming regions to heat the ink and vaporize and dry the solvent in the aqueous ink or the organic solvent ink to fix a hole transporting material or an electron transporting material on the panel substrate.

4 Claims, 16 Drawing Sheets

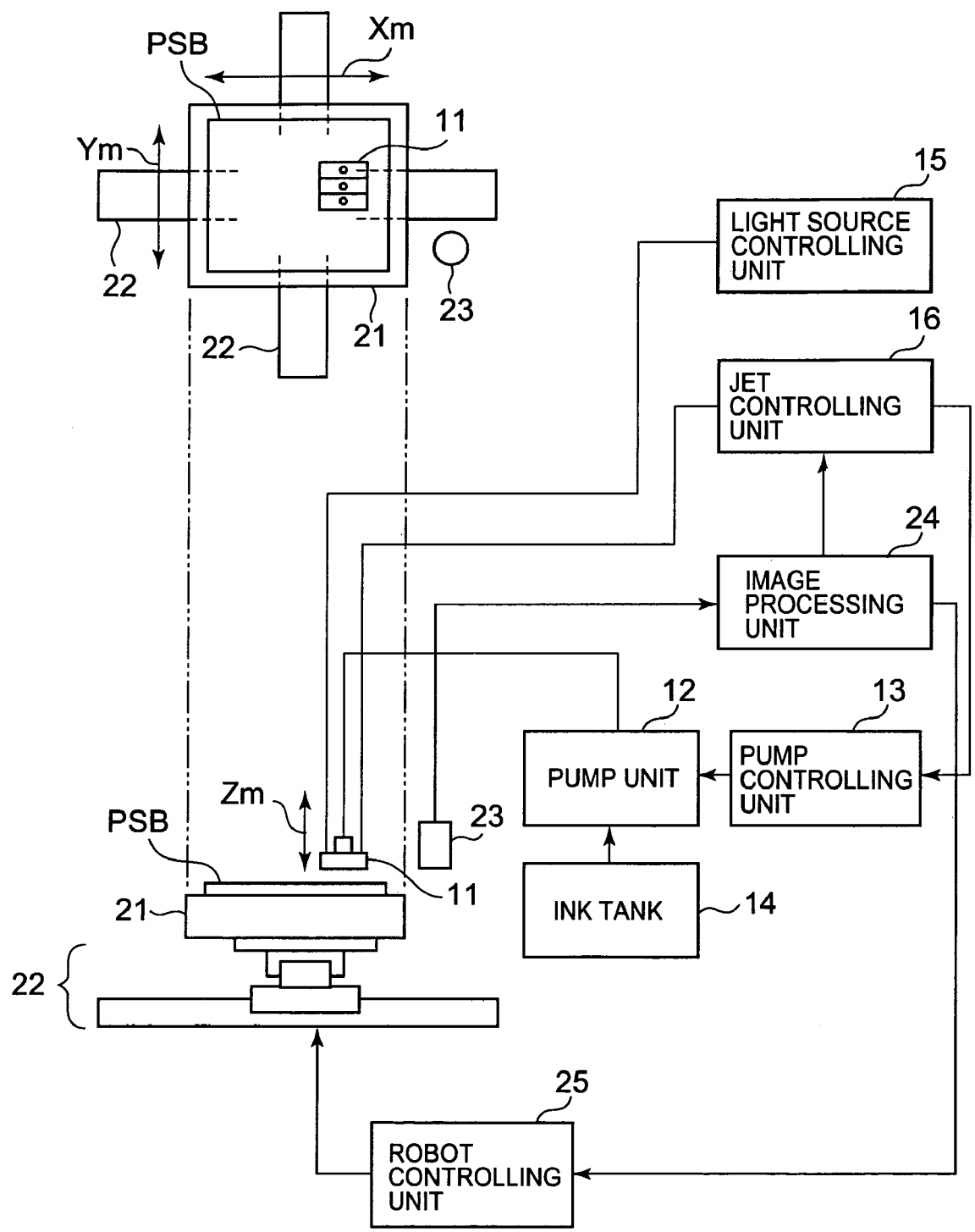

A-A CROSS SECTION

MANUFACTURING EQUIPMENT OF DISPLAY DEVICE AND MANUFACTURING METHOD OF DISPLAY DEVICE

BACKGROUND OF THE INVENTION

1. Field of the Invention

The present invention relates to a manufacturing equipment of a display device and a manufacturing method of a display device, and particularly relates to a manufacturing equipment for manufacturing a display device having a display panel on which arrayed are a plurality of display pixels having a light emitting element which has a light emitting function layer formed therein with a liquid material comprising a light emitting function material coated, and a manufacturing method for forming the light emitting function layer in a region in which each display pixel arrayed on the display panel is to be formed.

2. Description of the Related Art

Recently, as next-generation display devices that follow liquid crystal display devices (LCD) widely used as monitors and displays of personal computers, video equipment, portable information devices, etc., displays (display devices) having a display panel of a light emitting element type, on which self light emitting elements such as organic electroluminescence elements (hereinafter abbreviated as "organic EL element"), light emitting diodes (LED), etc. are arrayed in two dimensions, have been vigorously researched and developed so that they can be practically used and become widespread.

Particularly, a light emitting element type display that is adapted to the active matrix drive system has a higher display response speed and no view angle dependency and can obtain a display image with a higher luminance, a higher contract, a higher preciseness, etc. as compared with a liquid crystal display device. And such a light emitting element type display is advantageous since it can be formed into a slimmer and lighter body because it requires no backlight unlike a liquid crystal display device.

Here, a basic structure of a known organic EL element will be briefly explained, as an example of a self light emitting element used in a light emitting element type display.

FIG. 15 is a schematic cross sectional diagram showing a basic structure of an organic EL element.

As shown in FIG. 15, the organic EL element roughly has a structure where an anode (positive pole) electrode 112, an organic EL layer (light emitting function layer) 113 made of an organic compound, etc. (organic material), and a cathode (negative pole) electrode 114 are sequentially stacked on one surface side (the upper side in the diagram) of an insulating substrate 111 made of a glass substrate or the like. The organic EL layer 113 has a stacked structure of, for example, a hole transporting layer (hole injection layer) 113a made of a hole transporting material (hole injection layer forming material) and an electron-transporting light emitting layer (light emitting layer) 113b made of an electron-transporting light emitting material.

The organic EL element having the above-described element structure emits light (excited light) L based on energy that is produced by the recombination of holes and electrons that are injected into the hole transporting layer 113a or into the electron-transporting light emitting layer 113b when a positive voltage is applied to the anode electrode 112 and a negative voltage is applied to the cathode electrode 114 from a direct-current voltage source 115 as shown in FIG. 15. At this time, the light emitting intensity of the light L is controlled according to the amount of the current that flows across the anode electrode 112 and the cathode electrode 114.

Here, by forming either one of the anode electrode 112 and the cathode electrode 114 by using an electrode material having optical transparency, and forming the other of the two by using an electrode material having a light shielding characteristic and reflectivity, it is possible to realize an organic EL element having a bottom emission type light emitting structure which emits light L through the insulating substrate 111 as shown in FIG. 15, or an organic EL element having a top emission type light emitting structure which emits light L toward the side of the cathode electrode 114 on the upper surface without the light passing through the insulating substrate 111.

Various low molecular or high molecular organic materials are known as the hole transporting material or the electron-transporting light emitting material for making the organic EL layer 113 (the hole transporting layer 113a and the electron-transporting light emitting layer 113b) of the organic EL element described above.

Generally, a low molecular organic material imparts a relatively high light emitting efficiency to the organic EL layer, but requires vapor deposition to be applied in its manufacturing process. Therefore, in selectively forming a thin organic film made of the low molecular material only on the anode electrode of the pixel forming region, it is necessary to use a mask for preventing the low molecular material from being vapor-deposited on the regions other than the anode electrode. And since this cannot avoid the low molecular material being adhered even onto the surface of the mask, there is a problem that the material loss is large in the manufacturing process and highly accurate patterning is difficult.

On the other hand, a high molecular organic material gives a lower light emitting efficiency to the organic EL layer than given by a low molecular organic material, but it can allow the use of an ink jetting method (liquid drop jetting method) or the like as a wet film forming method. Therefore, only the pixel forming region (the region on the anode electrode) can be selectively coated with the solution of the organic material, providing an advantage in the manufacturing process that a thin film of the organic EL layer (the hole transporting layer and the electron-transporting light emitting layer) can be formed efficiently and finely.

In the manufacturing process of an organic EL element having an organic EL layer made of such a high molecular organic material, the organic EL layer 113 is formed roughly through the step of forming an anode electrode (positive electrode) on each region (pixel forming region) on which a display pixel is to be formed on an insulating substrate (panel substrate) made of a glass substrate or the like, forming a partitioning wall (bank) made of an insulating resin material or the like on the boundary between adjoining display pixels, and then, with the use of an ink jetting device, coating a liquid material, which is made of a high-molecular organic hole-transporting material dispersed or dissolved in a solvent, on the region surrounded by the partitioning wall and beating and drying the coated region, thereby to form the hole transporting layer 113a shown in FIG. 15, and sequentially through the step of coating a liquid material made of a high-molecular organic electron-transporting light emitting material dispersed or dissolved in a solvent with subsequent heating and drying to form the electron-transporting light emitting layer 113b shown in FIG. 15.

According to the manufacturing method using a wet film forming method such as the ink jetting method, etc., the above-described partitioning walls continuously formed to project from the insulating substrate have a function of defining each pixel forming region and preventing the phenomenon of the light emitting colors mixing (color mixing), etc. between the display pixels, due to liquid materials of different colors mixing into adjoining pixel forming regions when the liquid materials made of the high molecular organic material are coated.

The structure of an organic EL element (display panel) with such a partitioning wall and a manufacturing method using the ink jetting manner for forming an organic EL layer (a hole transporting layer and an electron-transporting light emitting layer) are specifically explained in, for example, Unexamined Japanese Patent Application KOKAI Publication No. 2001-76881. In addition to the above-described ink jetting method, methods utilizing various other printing techniques such as letterpress printing, screen printing, offset printing, gravure printing, etc. are proposed for the manufacturing process of an organic EL element having an organic EL layer made of a high-molecular organic material.

However, according to the manufacturing method of an organic EL layer (a hole transporting layer and an electron-transporting light emitting layer) using a wet film forming method such as the ink jetting method described above, etc., the liquid material tends to aggregate at the circumferential portion of the anode electrode 112 and partitioning wall 121 and the ends of the liquid surface of the coating liquid LQD are pressed up along the side surfaces of the partitioning wall 121 as shown in FIG. 16 to make the coating thickness large at the circumferential portion, due to the characteristic (water repellency) of the surface of the partitioning wall formed to protrude at the boundary between the display pixels (pixel forming regions), the surface tension and cohesion attributed to the solvent component in the liquid material (coating liquid) made of an organic material, and a drying manner after the liquid material is coated, etc., whereas the liquid material is coated thinly at about the center portion of the anode electrode 112. Therefore, there is a problem that the overall thickness of the organic EL layer becomes uneven. Note that FIG. 16 is a schematic diagram for explaining the problem of the manufacturing process of the organic EL element according to prior art.

Such variation of the film thickness of the organic EL layer formed in the pixel forming region, that occurs between the peripheral region (circumferential portion) and the center region (about the center portion) makes a light emission drive current, which is supplied in a light emitting operation, flow intensively in the center region where the film thickness is thin to enable the light L to be emitted only from about the center region. Thus, there is a problem that the ratio (the so-called aperture ratio) of the light emitting region that is occupied in the display panel (or the pixel forming region) decreases to deteriorate the quality of the displayed image, and degeneration of the organic EL layer (organic EL element) is severe because the light emission drive current flowing in the center region is too large, thereby reducing the reliability and longevity of the display panel.

SUMMARY OF THE INVENTION

Hence, in consideration of the above-described problem, an object of the present invention is to provide a manufacturing equipment of a display device in which a light emitting function layer (organic EL layer) having a uniform film thickness can be formed over about the entire area of a pixel forming region of a display pixel, and a manufacturing method of a display device utilizing the manufacturing equipment.

A manufacturing equipment of a display device according to a first aspect of the present invention is a manufacturing equipment of a display device having a display panel on which a plurality of pixels are arrayed, and comprises:

a printer head which comprises a jetting unit having a nozzle for jetting and coating a material solution on pixel-regions on which the plurality of pixels are to be formed, and a heating unit disposed adjacent to the jetting unit, for heating and drying the material solution coated on the pixel-regions.

The heating unit may be positioned at a back of the jetting unit in a scan-moving direction of the printer head when coating the material solution on the pixel-regions.

The heating unit may have a pair of heating members, which are disposed at a front and a back of the jetting unit in a scan-moving direction of the printer head when coating the material solution on the pixel-regions.

The jetting unit and the heating unit may be arranged in a direction perpendicular to a scan-moving direction of the printer head when coating the material solution on the pixel-regions.

The jetting unit and the heating unit may be formed integrally.

The jetting unit may have a plurality of nozzles, which are arranged in a direction perpendicular to a scan-moving direction of the printer head when coating the material solution on the pixel-regions.

The heating unit may comprise a light source for radiating infrared light to the material solution coated on the pixel-regions, to heat and dry the material solution.

A manufacturing method of a display device according to a second aspect of the present invention is a manufacturing method of a display device having a display panel on which a plurality of pixels are arrayed, and comprises:

a step of jetting and coating a material solution on pixel-regions on which the plurality of pixels are to be formed; and a step of heating and drying the material solution coated on the pixel-regions, in parallel with the step of coating the material solution.

The step of heating and drying the material solution may be performed immediately after the material solution is coated on each of the pixel-regions.

At the step of heating and drying the material solution, infrared light may be radiated to the material solution coated on the pixel-regions, to heat and dry the material solution.

The manufacturing equipment of a display device according to the present invention and the manufacturing method of a display device utilizing the manufacturing equipment according to the present invention can realize a display panel on which a light emitting function layer (charge transporting layer, organic EL layer), whose thickness is uniform over generally the entire area of a pixel forming region (pixel electrode) of each display pixel having a light emitting element, is formed.

BRIEF DESCRIPTION OF THE DRAWINGS

These objects and other objects and advantages of the present invention will become more apparent upon reading of the following detailed description and the accompanying drawings in which:

FIGS. 1A and 1B are schematic structure diagrams showing a first embodiment of a display device manufacturing method according to the present invention;

DETAILED DESCRIPTION OF THE PREFERRED EMBODIMENTS

Figure 2A:
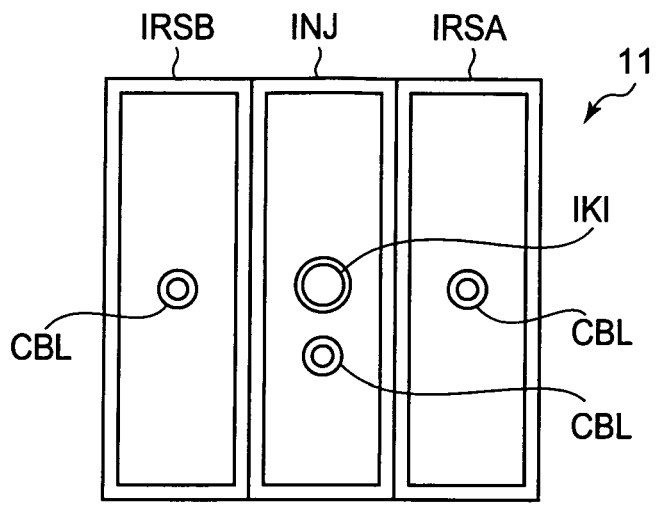
FIGS. 2A to 2D are schematic structure diagrams showing an example of a printer head used in the display device manufacturing equipment according to the present embodiment.

A display device manufacturing equipment and a display device manufacturing method according to the present invention will be specifically explained by showing embodiments.

First Embodiment

<Display Device Manufacturing Equipment>

First, a display device manufacturing equipment according to the present invention will be explained.

FIGS. 1A and 1B are schematic structure diagrams showing the first embodiment of a display device manufacturing equipment according to the present invention.

The display device manufacturing equipment (display panel manufacturing equipment) according to the present embodiment roughly comprises an ink jetting mechanism section and a substrate moving mechanism section. The ink jetting mechanism section jets, as a hole transporting material, an aqueous ink (hole transporting material containing liquid) having a strong acidity, which is obtained by dissolving or diffusing, for example, polyethylenedioxithiophene PEDOT, which is a conductive polymer, and polystyrenesulfonate PSS, which is a dopant (hereinafter, these are abbreviated as "PEDOT/PSS"), in an aqueous solvent such as water, ethanol, ethylene glycol, etc., and jets, as an electron-transporting light emitting material, an aqueous ink or an organic solvent ink (light emitting material containing liquid), which is obtained by dissolving or diffusing, for example, florene polymer or phenylenevinylene polymer in an aromatic organic solvent such as tetraphosphor, tetramethylbenzene, mesitylene, xylene, toluene, etc. or in water. The substrate moving mechanism section moves in the directions of a two-dimensional coordinate system, relatively to a printer head (to be described later in detail) formed in the ink jetting mechanism section, while a panel substrate (insulating substrate) to be coated with the above-described aqueous ink and organic solvent ink is mounted thereon.

(Ink Jetting Mechanism Section)

As shown in FIGS. 1A and 1B, the ink jetting mechanism section comprises at least a printer head 11 for jetting the above-described aqueous ink or organic solvent ink and radiating infrared light for heating and drying the coated aqueous ink or organic solvent ink, a pump unit 12 for supplying the aqueous ink or the organic solvent ink to the printer head 11, a pump controlling unit 13 for controlling supply conditions such as the amount or timing of supplying the aqueous ink or the organic solvent ink to the printer head 11 from the pump unit 12, an ink tank 14 for storing the aqueous ink or the organic solvent ink, and a light source controlling unit 15 for controlling radiation conditions such as the timing at which the printer head 11 radiates infrared light, etc. FIG. 1A is a structure diagram of the printer head 11 and a substrate stage 21 as seen from the top. The substrate stage 21 can move to an arbitrary position on an X-Y plane (Xm direction and Ym direction), by means of an X-Y dual axial robot 22. FIG. 1B is a structure diagram of the control system when the printer head 11 and the substrate stage 21 are seen from their side. The printer head 11 can move up or down to a predetermined position in a Zm direction (upward and downward direction).

(Printer Head)

Figure 2B:
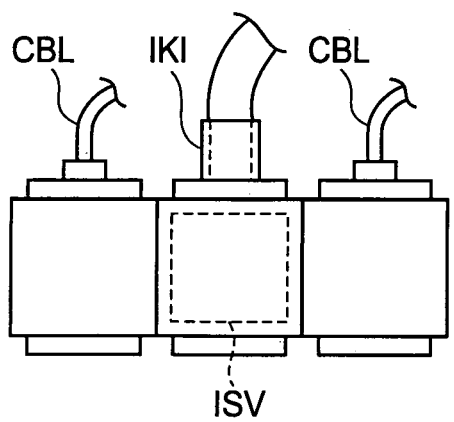
Figure 2C:
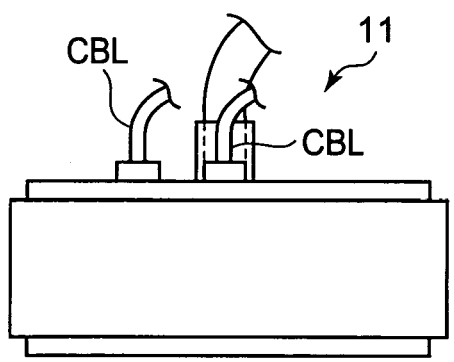
Figure 2D:
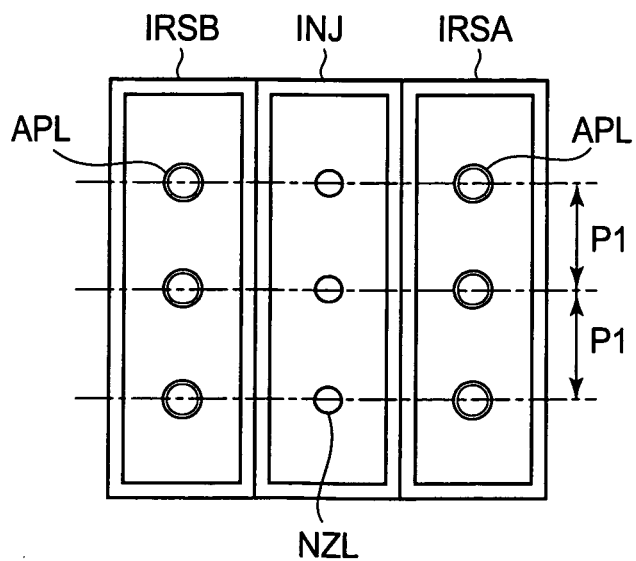

FIGS. 2A to 2D are schematic structure diagrams showing an example of the printer head 11 to be used in the display device manufacturing equipment according to the present embodiment. FIG. 2A is a plan view (top view) of the printer head 11. FIG. 2B is a front elevation of the printer head 11. FIG. 2C is a side elevation of the printer head 11. FIG. 2D is a bottom view (nozzle surface view) of the printer head 11.

As shown in, for example, FIGS. 1A and 1B, the printer head 11 is set above the substrate mounting surface of the substrate stage 21, at a predetermined position fixed with respect to the moving directions (the X-Y two axial directions; indicated by arrows Xm and Ym in FIG. 1A) of the substrate stage 21. Further, as shown in FIGS. 2A to 2D, the printer head 11 comprises an ink jetting unit (solution jetting unit) INJ for jetting the aqueous ink or the organic solvent ink onto the panel substrate PSB to coat the ink thereon, and a pair of infrared light source units (solution heating units) IRSA and IRSB provided adjacent to each other sandwiching the ink jetting unit INJ therebetween and functioning as heat sources for a drying process for irradiating the aqueous ink or the organic solvent ink coated on the panel substrate PSB with infrared light (or infrared ray) in a wavelength range of 800 nm to 25 μm. Particularly, according to the present embodiment, the ink jetting unit INJ and the pair of infrared light source units IRSA and IRSB are integrally formed.

Specifically, the ink jetting unit INJ has a hollow housing structure, and comprises an ink storage unit ISV for storing the aqueous ink or the organic solvent ink, an inlet port IKI formed on the top surface (FIG. 2A) of the ink storage unit ISV, from which the aqueous ink or the organic solvent ink supplied from the pump unit 12 described later is supplied into the ink storage unit ISV, a plurality (three, according to the present example) of jetting ports (nozzles) NZL formed in the bottom surface (nozzle surface; FIG. 2D) of the ink storage unit ISV and provided in line in a direction (the upward and downward direction of the diagram; a direction perpendicular to a later-described scan-moving direction) in which the ink jetting unit INJ is elongate, for jetting the aqueous ink or the organic solvent ink supplied into the ink storage unit ISV, and a control line CBL connected to a jet controlling unit 16, which is for outputting a control signal for controlling the ink jetting unit INJ to jet ink of an amount that is based on image information data input to an image processing unit 24.

Since the inlet port IKI formed on the ink jetting unit INJ is connected to an outlet port of the later-described pump unit 12 by a tube (or a duct) and lets in the aqueous ink or the organic solvent ink from the ink tank 14 with the pump unit 12 appropriately driven by the pump controlling unit 13 based on an amount of ink ejection from the ink jetting unit INJ that is computed by the jet controlling unit 16, the ink storage unit ISV is full of ink all time. The ink jetting unit INJ (printer head 11) is a piezoelectric element such as a piezo element, etc., or a heat-generating resistor element, and jets the aqueous ink or the organic solvent ink of a predetermined amount from the plurality of jetting ports NZL simultaneously, onto the substrate stage 21, in accordance with a control signal input from the control line CBL. The jetted aqueous ink or organic solvent ink is coated on a predetermined region (pixel forming region) of the panel substrate PSB, by the substrate stage 21 being moved relatively to the printer head 11 in the X-Y two axial directions (two-dimensional coordinate directions), as will be described later.

The infrared light source units IRSA and IRSB each comprise an infrared light source for radiating infrared light (specifically, infrared laser light, infrared ray, etc.) toward the substrate stage 21. A control line CBL for driving each infrared light source is connected to, for example, the top surface (FIG. 2A) of the infrared light source units IRSA and IRSB. A plurality (according to the present example, three, provided in a direction perpendicular to the scan-moving direction) of radiating portions APL, which are for radiating infrared light are provided in the bottom surface (FIG. 2C) of each infrared light source unit, such that the radiating portions APL are located on scan-moving direction lines (indicated by dashed-dotted lines in the leftward and rightward direction of the diagrams) of the respective jetting ports NZL formed in the ink jetting unit INJ. The scan-moving direction lines are for when the aqueous ink or the organic solvent ink is continually coated on the panel substrate PSB mounted on the substrate 21. The infrared light radiated from the respective radiating portions APL may be divided ones that are output from a single light source provided in each of the infrared light source units IRSA and IRSB, or individual light sources may be prepared correspondingly to the respective radiating portions APL of each of the infrared light source units IRSA and IRSB. The rays of infrared light are each output, with the light flux converged to a desired diameter through an optical system such as a microlens.

Based on a control signal output from the light source controlling unit 15, the infrared light source units IRSA and IRSB each radiate infrared light locally to the aqueous ink or the organic solvent ink coated by the ink jetting unit INJ on the panel substrate PSB. Therefore, the solvent in the aqueous ink or the organic solvent ink is heated and vaporized by the heat radiation, and a hole transporting material or an electron-transporting light emitting material is quickly fixed on the panel substrate PSB. The timing to radiate the infrared light based on the control signal is set to be generally synchronous with the timing at which the ink jetting unit INJ jets the aqueous ink or the organic solvent ink.

Thus, at a step of the printer head 11 scanning the panel substrate PSB and coating the aqueous ink or the organic solvent ink, an operation (coating operation) by the ink jetting unit INJ for jetting out and coating the aqueous ink or the organic solvent ink and an operation (drying operation) by the infrared light source unit IRSA or IRSB for radiating infrared light to the coated aqueous ink or organic solvent ink to dry the ink can be simultaneously performed in parallel. The details will be explained in a later-described manufacturing method.

The printer head 11 shown in FIGS. 2A to 2D has been explained as having a structure that the aqueous ink or the organic solvent ink stored in the single ink storage unit ISV provided in the ink jetting unit INJ is jetted from the plurality of jetting ports NZL simultaneously, to coat the ink on the pixel forming region on the panel substrate PSB.

Figure 4A:
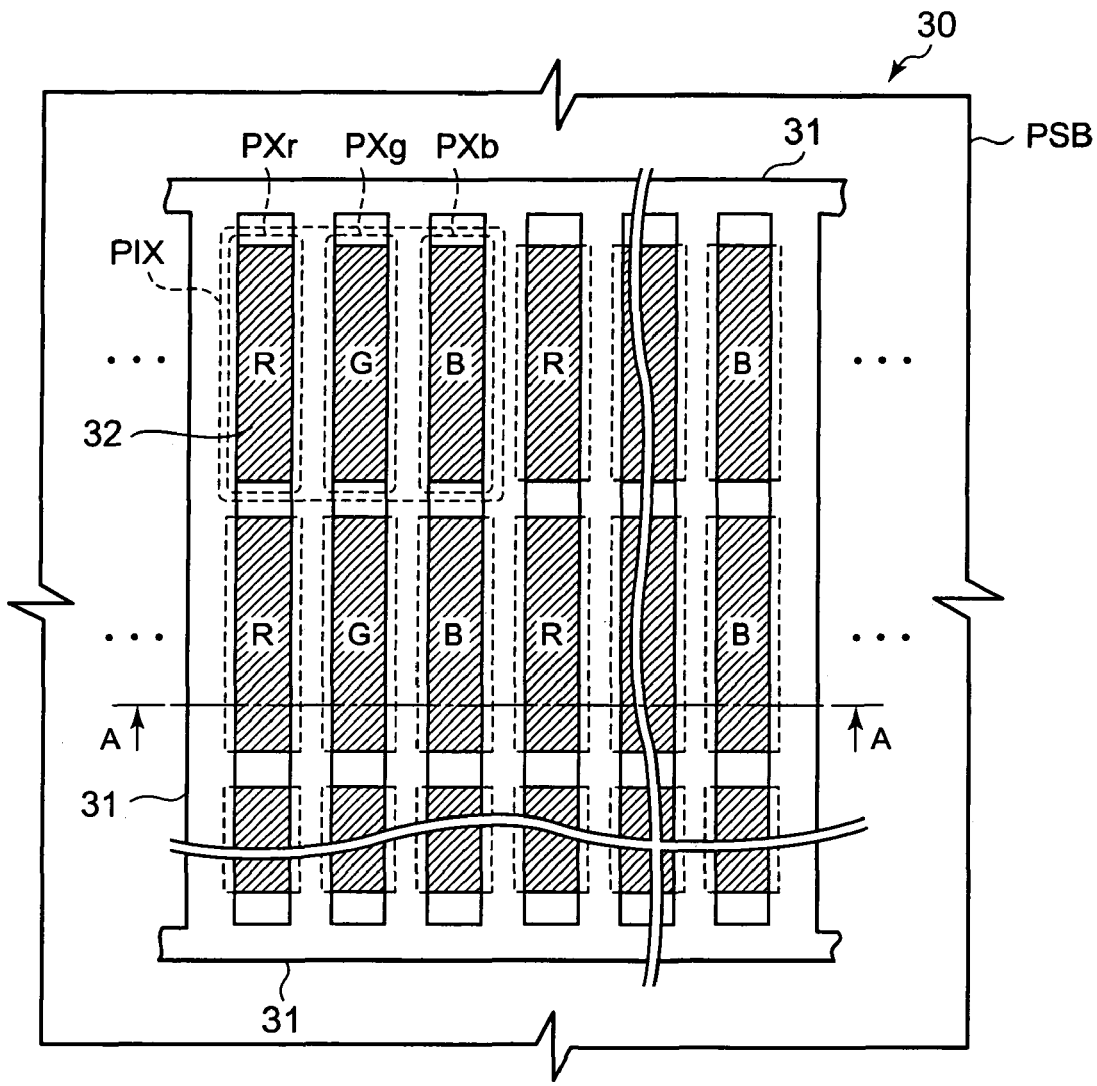
FIGS. 4A and 4B are schematic diagrams of a principal part showing an example of pixel array on a display panel to be manufactured according to a display device manufacturing method of the present embodiment.
Figure 4B:
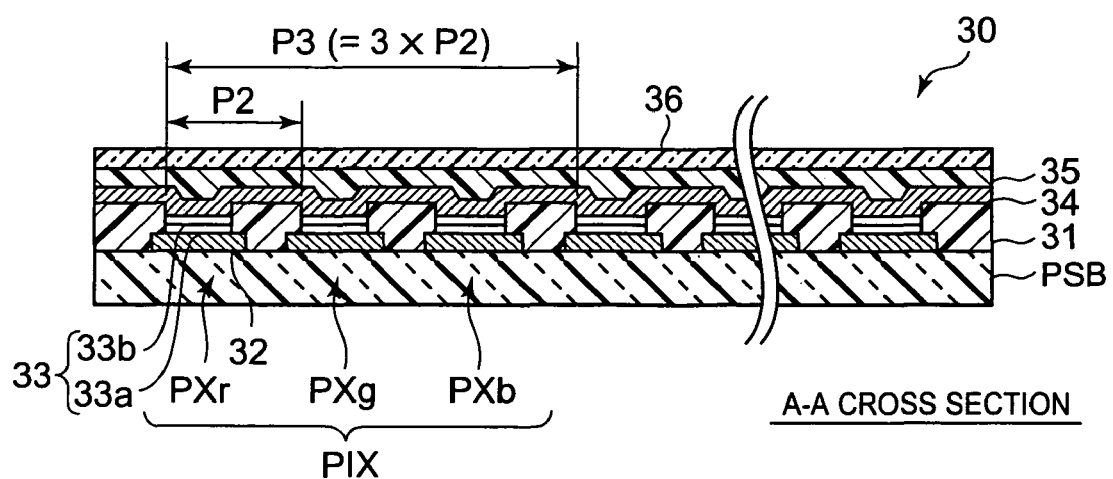

In this case, as shown in FIG. 2D, by setting the arrangement interval P1 between the plurality of jetting ports NZL provided on the ink jetting unit INJ such that the interval P1 corresponds to the arrangement interval between adjoining pixel forming regions arrayed two-dimensionally on the panel substrate PSB (for example, the interval P2 between adjoining color pixels on the display panel 30 shown in FIGS. 4A and 4B) (P1=P2), it is possible to finely coat the panel substrate PSB with the hole transporting material containing liquid that contains a hole transporting material or the light emitting material containing liquid that contains an electron-transporting light emitting material for forming a light emitting layer for a single-color light emission adapted to a monochrome display panel.

Alternatively, color pixels can finely be patterned by setting the arrangement interval P1 between the jetting ports NZL such that it corresponds to the arrangement interval between color pixels of the same color that are included in adjoining display pixels arrayed two-dimensionally on the panel substrate PSB (for example, the interval P3 between closest color pixels having the same color of light emission shown in FIGS. 4A and 4B) (P1=P3=3×P2), and repeating the operation of coating the light emitting material containing liquid that contains an electron-transporting light emitting material for forming a light emitting layer for light emission of any color among the three colors of red (R), green (G), and blue (B) corresponding to a color display panel, three times for color pixels PXr, color pixels PXg, and color pixels PXb respectively.

The printer head 11 (ink jetting unit INJ) that can be used for the display device manufacturing equipment according to the present invention is not limited to the above-described example, but may be such one whose ink jetting unit INJ comprises, for example, separate ink storage units corresponding to red (R), green (G), and blue (B) respectively, inlet ports for separately inletting organic solvent inks of R, G, and B into the respective ink storage units, and jetting ports for separately jetting the organic solvent inks of R, G, and B inlet to the ink storage units respectively.

In this case, by setting the arrangement interval P1 shown in FIG. 2D between the plurality of jetting ports formed on the ink jetting unit INJ such that it corresponds to the arrangement interval between adjoining color pixels of red (R), green (G), and blue (B) that are arrayed two-dimensionally on the panel substrate PSB (for example, the interval P2 between adjoining color pixels on the display panel 30 shown in FIGS. 4A and 4B) (P1=P2), it is possible to synchronously coat the pixel forming regions of the respective color pixels with light emitting material containing liquids, which each contain an electron-transporting light emitting material for forming a light emitting layer for light emission of any of the three colors of red (R), green (G), and blue (B) corresponding to a color display panel.

The printer head 11 may be attached to an arm member or the like (unillustrated) that can be moved in a direction (indicated by an arrow Zm) perpendicular to the moving directions (X-Y directions; see FIG. 1A) of the substrate stage 21 as shown in FIG. 1B, so that the clearance between the jetting ports NZL of the ink jetting unit INJ and the panel substrate PSB (or the substrate stage 21) (the distance from the panel substrate PSB in the vertical direction) can be adjusted.

(Pump Unit)

The pump unit 12 absorbs the aqueous ink or the organic solvent ink that is stored in the ink tank 14 and sends the ink to the printer head 11 (ink jetting unit INJ) based on a drive signal output from the pump controlling unit 13, and the ink storage unit ISV is thus filled with the aqueous ink or the organic solvent ink.

(Jet Controlling Unit)

The jet controlling unit 16 outputs a control signal for controlling the amount of ejection by the printer head 11 to the control line CBL based on an analysis result obtained by the image processing unit 24 analyzing image information data, and also outputs ejection amount data to the pump controlling unit 13.

(Substrate Moving Mechanism Section)

As shown in FIGS. 1A and 1B, the substrate moving mechanism section comprises, for example, the substrate stage 21 on which the panel substrate PSB is mounted and fixed, the X-Y dual axial robot 22 for moving the substrate stage 21 in two axial directions of X direction and Y direction that are orthogonal to each other, an alignment (positioning) camera 23 for detecting and adjusting the mounting position (matching status of an alignment mark) of the panel substrate PSB with respect to the substrate stage 21 (or to the printer head 11 fixed at a predetermined reference position with respect to the substrate stage 21), the image processing unit 24 for analyzing an image picked up by the alignment camera 23, and a robot controlling unit 25 for controlling the amount of movement of the X-Y dual axial robot 22 based on an analysis result so that the substrate stage 21 may be set to a predetermined positional relation with respect to the printer head 11.

The substrate stage 21 has, though not illustrated, a vacuum attracting mechanism or a mechanical support system for fixing the panel substrate PSB mounted thereon at a predetermined position. The X-Y dual axial robot 22 moves the substrate stage 21 (i.e., the panel substrate PSB mounted and fixed) attached on the X-Y dual axial robot 22 in the two-dimensional coordinate directions and sets the substrate stage 21 to a predetermined positional relation with respect to the printer head 11, by moving in the X axial direction and in the Y axial direction independently.

Further, the substrate stage 21 is structured to be also adjustable in the rotational direction (θ direction) in addition to the above-described X-Y two axial directions, for the purpose of the alignment (positioning) of the initial jetting position of the printer head 11 with respect to the panel substrate PSB. Likewise the printer head 11, the alignment camera 23 for detecting the alignment mark, which is formed on the panel substrate PSB in advance, is also fixed at a predetermined position with respect to the moving directions of the substrate stage 21.

FIGS. 3A to 3D are conceptual diagrams for explaining an operation for dripping the aqueous ink or the organic solvent ink and an operation for drying the ink, with the use of the printer head 11 used in the display device manufacturing equipment according to the present embodiment.

In the display device manufacturing equipment described above, the ink jetting unit INJ of the printer head 11 drips the aqueous ink or the organic solvent ink onto the pixel forming regions on the panel substrate PSB at a first timing, and the dripped aqueous ink or organic solvent ink immediately spreads over the pixel forming regions. Then, at a second timing, the infrared light source unit IRSA or IRSB provided adjacent to the ink jetting unit INJ radiates infrared light to the aqueous ink or the organic solvent ink spread over the pixel forming regions to heat the ink, vaporize and dry the solvent in the aqueous ink or the organic solvent ink and fix the charge transporting material such as the hole transporting material or the electron transporting material, etc. on the panel substrate PSB.

Figure 3A:
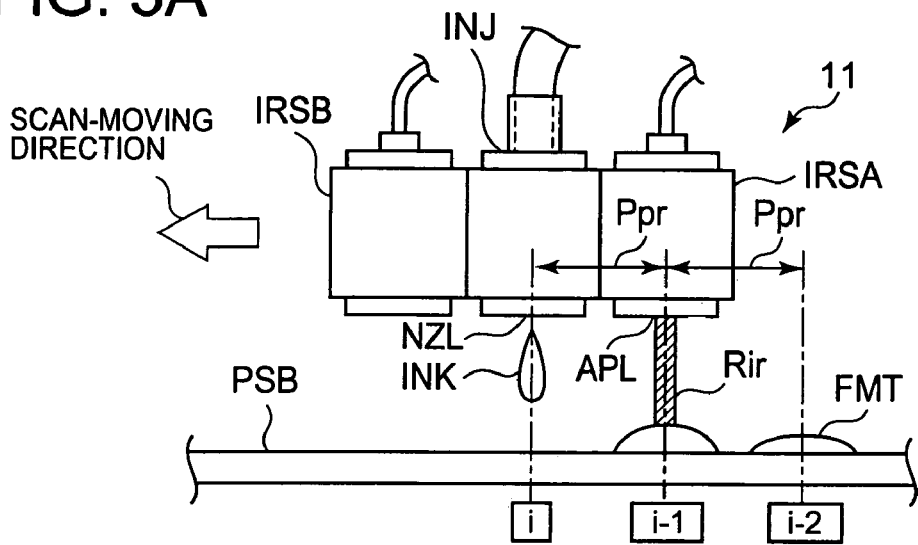
FIGS. 3A to 3C are conceptual diagrams for explaining an operation of coating an aqueous ink or an organic solvent ink and an operation of drying the ink, with the use of the printer head used in the display device manufacturing equipment according to the present embodiment.
Figure 3B:
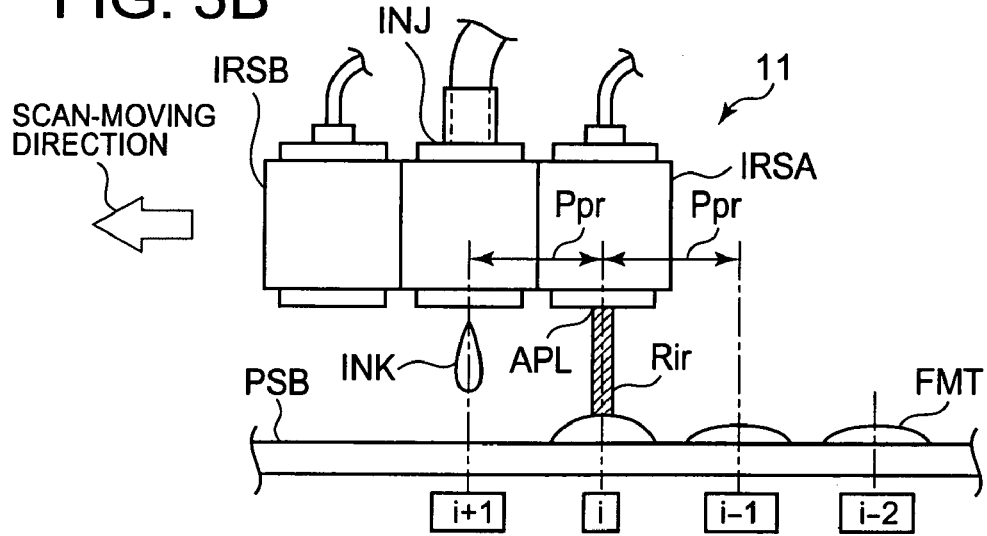

That is, in a case where, as shown in FIGS. 3A and 3B, the operation of dripping the aqueous ink or the organic solvent ink and the operation of drying the ink are performed while the printer head 11 is scan-moved relatively to the panel substrate PSB from the right to the left in the diagram (as indicated by an outline arrow in the diagram), first, the aqueous ink or the organic solvent ink INK is jetted and dripped onto the surface of the panel substrate PSB at the first timing as shown in FIG. 3A, in a state that the jetting ports NZL of the ink jetting unit INJ are positioned above desired pixel forming regions (specifically, right above pixel electrodes of organic EL elements).

Then, at the second timing, as shown in FIG. 3B, the printer head 11 is moved relatively to the panel substrate PSB (substrate stage 21) by a distance corresponding to an interval Ppr between the center of the jetting port NZL of the ink jetting unit INJ and the center of the infrared light radiating portion APL of the infrared light source unit IRSA formed adjacently and integrally with the ink jetting unit INJ, and infrared light Rir is radiated from the infrared light source unit IRSA provided adjacently at the right side of the ink jetting unit INJ onto the aqueous ink or the organic solvent ink INK dripped at the first timing, so that the solvent in the aqueous ink or the organic solvent ink INK may be heated and vaporized to fix the hole transporting material or the electron-transporting material dissolved in the aqueous ink or the organic solvent ink INK on the pixel forming regions and form a hole transporting layer or an electron-transporting light emitting layer made of an organic thin film FMT.

Figure 3C:
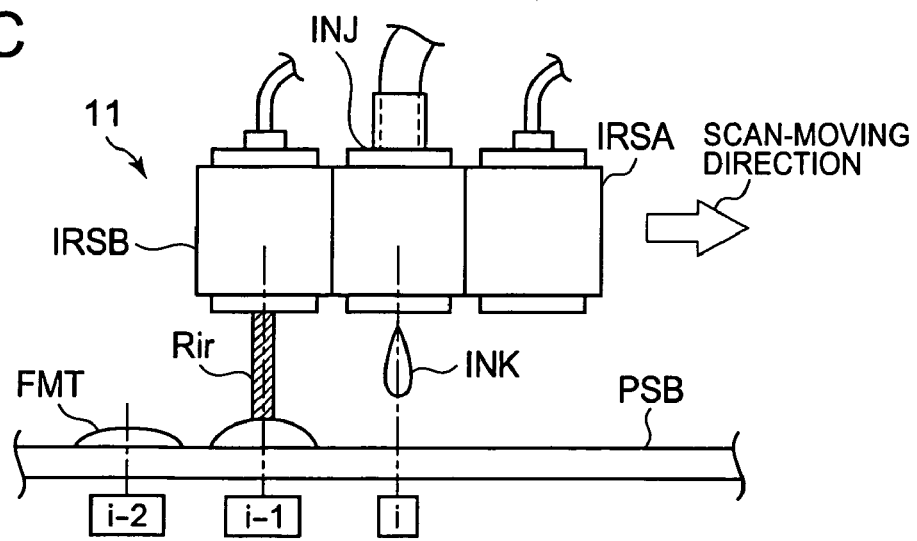

On the other hand, in a case where, as shown in FIG. 3C, the operation of dripping the aqueous ink or the organic solvent ink and the operation of drying the ink are performed while the printer head 11 is scan-moved relatively to the panel substrate PSB from the left to the right in the diagram (as indicated by an outline arrow in the diagram), at the second timing described above, infrared light Rir is radiated from the infrared light source unit IRSB provided adjacently at the left side of the ink jetting unit INJ onto the aqueous ink or the organic solvent ink INK dripped at the first timing, to heat and vaporize the solvent in the aqueous ink or the organic solvent ink INK and fix the hole transporting material or the electron transporting material on the pixel forming regions.

As described above, according to the present embodiment, regardless of whether in the right ward direction or in the leftward direction of the diagram the printer head 11 is scan-moved relatively to the panel substrate PSB (the pixel electrodes of the display pixels) to coat and dry the aqueous ink or the organic solvent ink INK, the infrared light source unit that is back in the scan-moving direction can be controlled to radiate infrared light in response to a control signal output from the light source controlling unit 15.

In FIGS. 3A to 3C, the aqueous ink or the organic solvent ink INK dripped on the panel substrate PSB (pixel electrodes) is illustrated, for expediency, as a dome shape due to its surface tension, for the purpose of conceptually showing the process of the infrared light source unit IRSA or IRSB radiating infrared light to the aqueous ink or the organic solvent ink to heat the ink, and the light flux of the infrared light is illustrated as being radiated while converged at about the center of the aqueous ink or the organic solvent ink INK. However, the aqueous ink or the organic solvent ink INK is coated to be spread to a certain degree within the pixel forming regions. Here, the infrared light may be radiated to the entire region of spread of the coated aqueous ink or organic solvent ink INK, or may be radiated onto at least a region to be the light emitting region within the pixel forming regions.

<Display Device Manufacturing Method>

Next, a manufacturing method of a display device (display panel) that involves the use of the manufacturing equipment described above will be explained.

First, a display panel to be manufactured by using the manufacturing equipment according to the present embodiment will be explained.

FIGS. 4A and 4B are schematic diagrams of a principal part showing an example of a pixel array on the display panel to be manufactured according to the display device manufacturing method of the present embodiment. FIG. 4A is a plan view of the display panel, and FIG. 4B is an A-A cross sectional diagram of the display panel of FIG. 4A. For facilitating understanding, the plan view of FIG. 4A shows only the relationship between the arrangement of a pixel electrode in each display pixel (color pixel) and the arrangement of partitioning walls (banks) for defining pixel forming regions, when the display panel is seen from its observer side. And the pixel electrodes and the partitioning walls are illustrated expediently with hatchings to make the arrangement of the pixel electrodes and partitioning walls clear.

As shown in FIG. 4A, the display panel 30 (display device) to be manufactured according to the manufacturing equipment of the present embodiment has color pixels PXr, PXg, and PXb having three colors of red (R), green (G), and blue (B) arrayed on one surface of the panel substrate PSB made of an insulating substrate such as a glass substrate or the like, such that the color pixels are sequentially and repeatedly arrayed in the horizontal direction of the diagram over a plural number (a multiple of 3) of columns, and are arrayed in the vertical direction of the diagram over a plural number of rows on the basis of a single color in each column. Here, adjoining color pixels PXr, PXg, and PXb having the three colors form a group and constitute one display pixel PIX.

As shown in FIGS. 4A and 4B, regions each made up of pixel forming regions of a plurality of color pixels PXr, PXg, or PXb, among the plurality of display pixels PIX (color pixels PXr, PXg, and PXb) two-dimensionally arrayed on one surface of the panel substrate PSB, that are arrayed in the vertical direction of FIG. 4A and thus unified in color, are defined on the display panel 30 by partitioning walls (banks) 31 provided on the one surface of the panel substrate PSB so as to project therefrom and form a planar pattern having a fence-like or a lattice-like shape. The pixel forming regions, which are included in each such defined region and in which a plurality of color pixels PXr, PXg, or PXb are formed, are each provided with a pixel electrode 32.

FIGS. 5A to 5H are cross sectional diagrams of manufacturing steps showing one example of the manufacturing method of the display device (display panel) using the manufacturing equipment according to the present embodiment. Here, a case will be explained that a color display panel, which comprises display pixels PIX each including a group of color pixels PXr, PXg, and PXb having three colors of red (R), green (G), and blue (B) shown in FIGS. 4A and 4B, is manufactured. And reference will appropriately be made to the above-described explanation of the printer head 11 (FIGS. 3A to 3C), regarding the step of coating the aqueous ink or the organic solvent ink INK to each color pixel. FIGS. 6A and 6B are conceptual diagrams for explaining the scan-moving path of the printer head 11 with respect to the panel substrate PSB (substrate stage 21), according to the manufacturing equipment of the present embodiment.

Figure 5A:
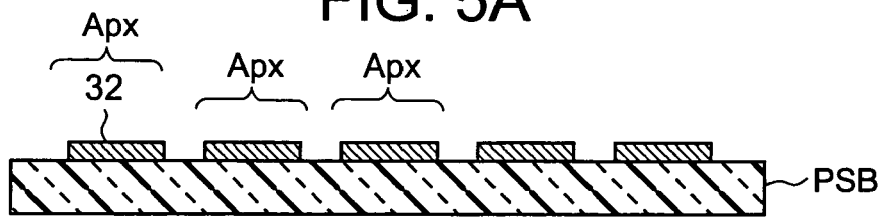
FIGS. 5A to 5H are cross sectional diagrams of manufacturing steps showing an example of a manufacturing method of a display device (display panel), utilizing the manufacturing equipment according to the present embodiment.
Figure 5B:
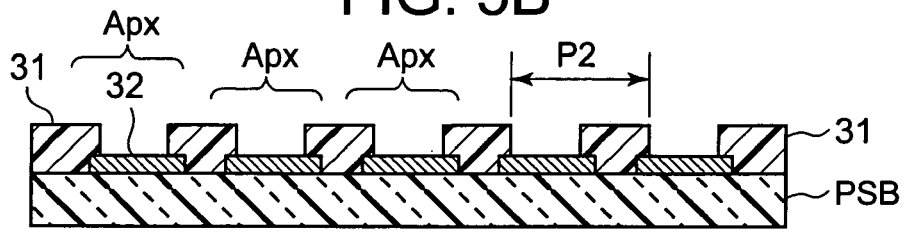
Figure 6A:
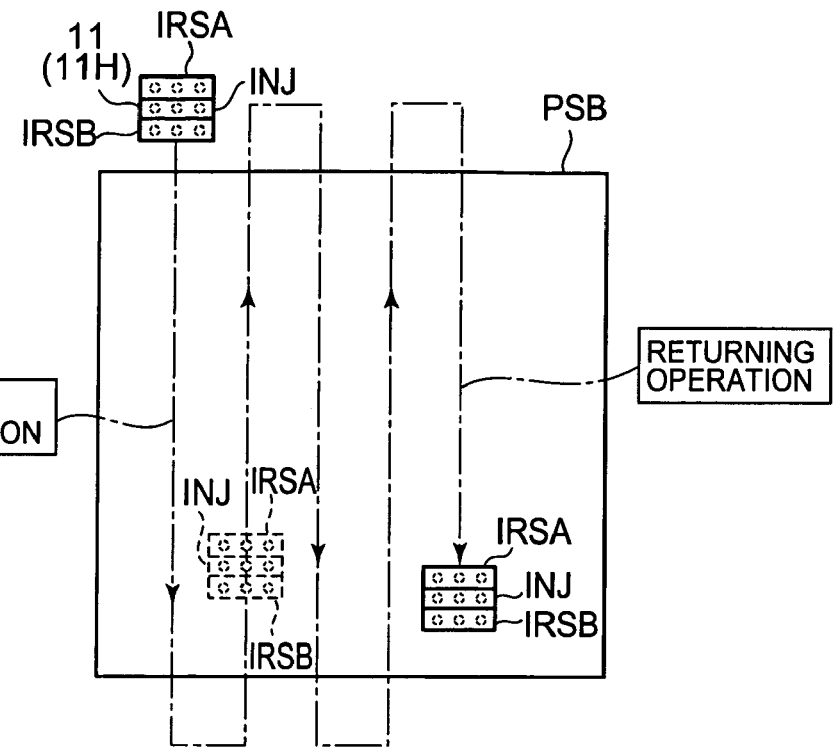
FIGS. 6A and 6B are conceptual diagrams for explaining a scan-moving path of the printer head over a panel substrate (substrate stage), according to the manufacturing equipment of the present embodiment.
Figure 6B:
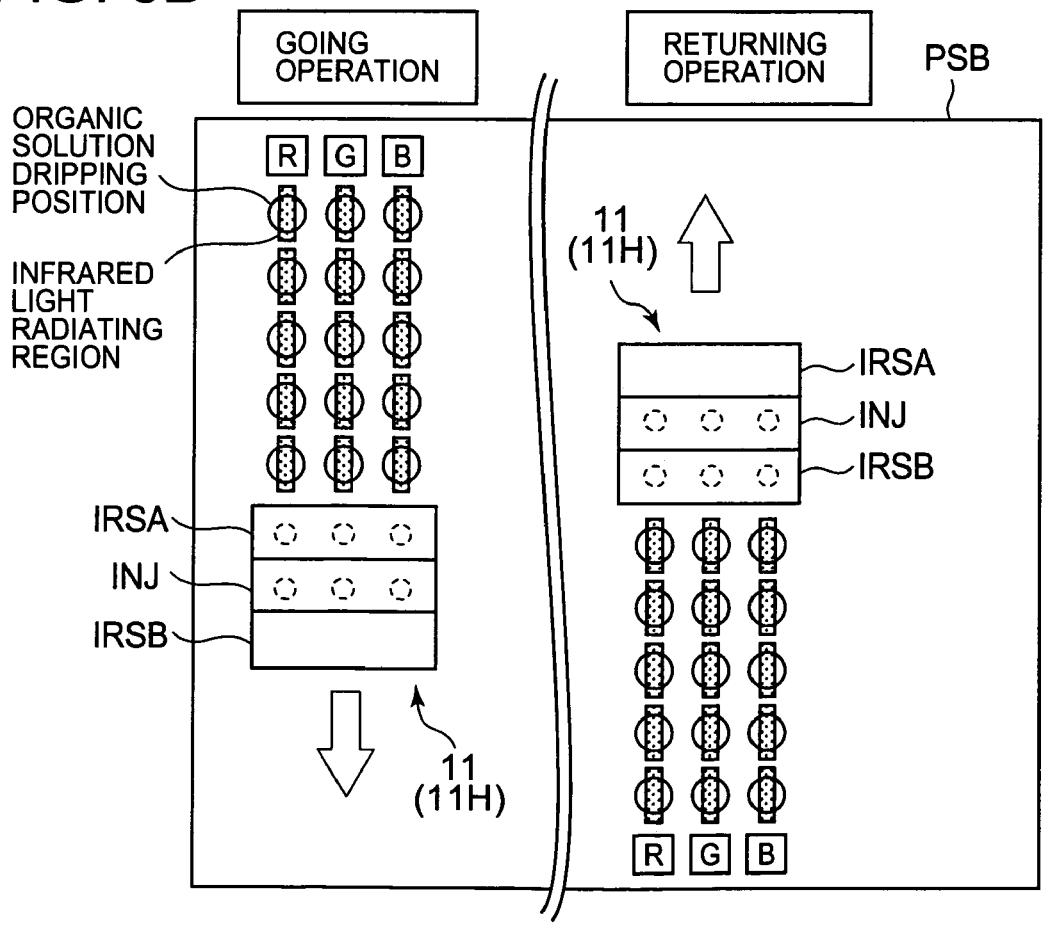

According to the display device manufacturing method of the present embodiment, first, a pixel electrode (for example, an anode electrode) 32 is formed, as shown in FIG. 5A, in each pixel forming region Apx defined on one surface side (the upper side of the diagram) of the panel substrate PSB, which is made of an insulating substrate such as a glass substrate, and then partitioning walls (banks) 31 made of an insulating resin material or the like are formed on the boundary between adjoining pixel forming regions Apx, as shown in FIG. 5B. It is preferred that the partitioning walls 31 have its surface treated for liquid repellency.

The pixel electrode 32 has its edges in the horizontal direction overlapping with the partitioning walls 31, and the center portion of the pixel electrode 32 is exposed in the pixel forming region Apx surrounded by the partitioning walls 31. According to the present embodiment, the structure in which only the pixel electrode 32 is formed in each pixel forming region Apx is illustrated for facilitating understanding. However, a drive control element (for example, a thin film transistor), which is connected to each pixel electrode 32 for controlling a light emission drive current to be supplied to a later-described organic EL layer 33 (organic EL element), may be provided on a lower layer than the pixel electrode 32.

Figure 5C:
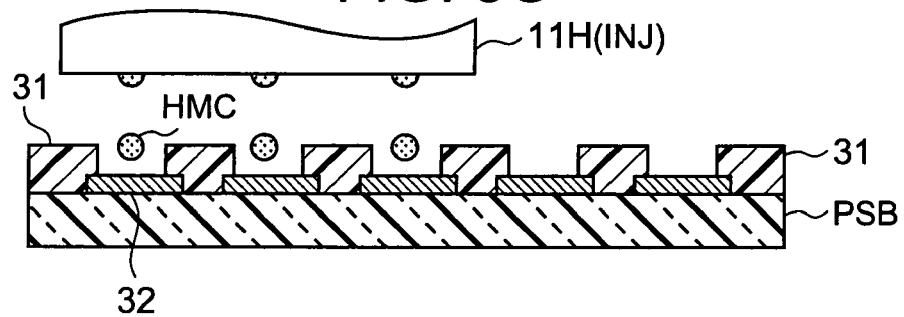

Next, as shown in FIG. 5C, with the use of a display device manufacturing equipment (see FIGS. 1 to 3) having the above-described structure, an organic solution (material solution; aqueous ink) HMC, which is obtained by adding a hole transporting material (for example, PEDOT/PSS described above) in an aqueous solvent (for example, water of 99 to 80 wt % and ethanol of 1 to 20 wt %), is turned into liquid drops of a predetermined amount, which is set by the above-described pump unit 12 and pump controlling unit 13, and dripped from an ink jetting unit (corresponding to the ink jetting unit INJ described above) of a printer head 11H (having an equivalent structure to the printer head 11 described above), to be coated on the pixel electrode 32 of each pixel forming region Apx.

Figure 5D:
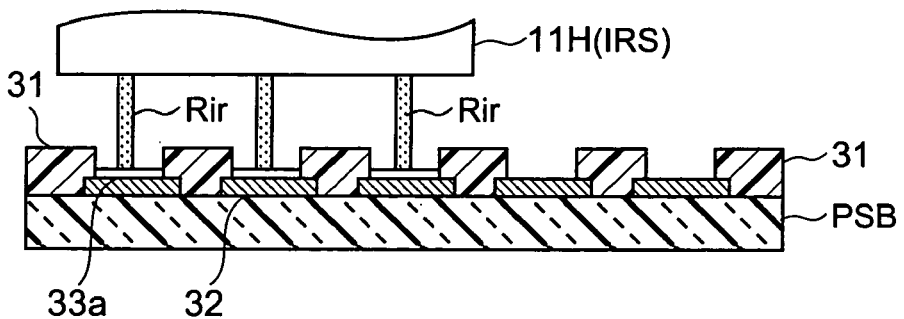

After this, as shown in FIG. 5D, the panel substrate PSB (substrate stage 21) is relatively moved such that an infrared light source unit (corresponding to the infrared light source unit IRSA or IRSB described above; indicated as "IRS" in the diagram for expediency) of the printer head 11H (printer head 11) is positioned right above the pixel electrode 32 coated with the organic solution HMC, and the infrared light source unit IRS radiates infrared light Rir to heat and vaporize the organic solution HMC and fix the hole transporting material on the pixel electrode 32 as a thin film to form a hole transporting layer 33a of an organic EL layer 33.

Figure 16:
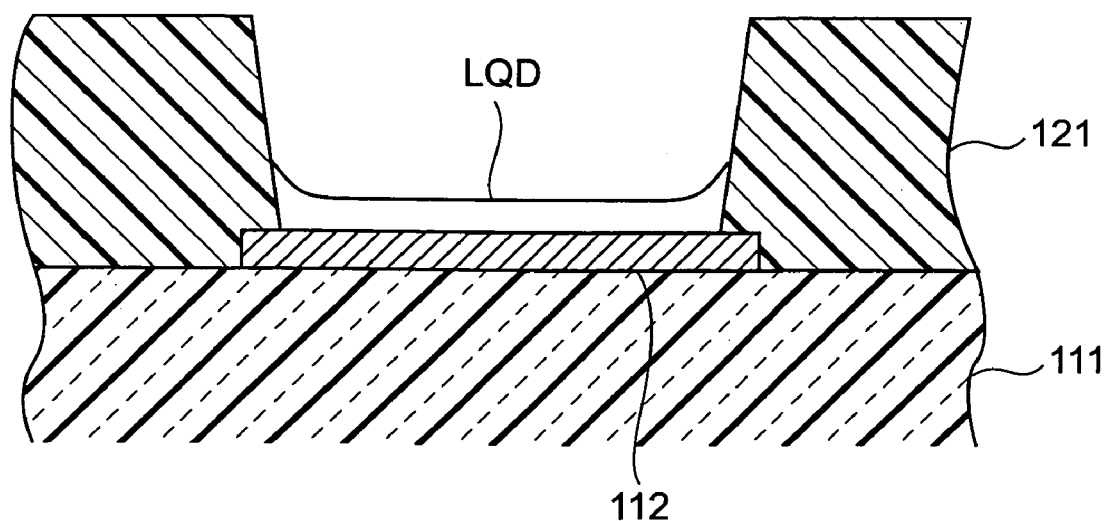
FIG. 16 is a schematic diagram for explaining a problem in a manufacturing process of an organic EL element according to prior art.

As in the explanation for the partitioning wall 121 of FIG. 16, since the aqueous ink or the organic solvent ink INK aggregates along the partitioning wall 31 due to its surface tension, the ink is apt to be deposited thickly at the circumferential region of each color pixel PXr, PXg, or PXb, and thinly at the center region of each color pixel PXr, PXg, or PXb. However, by the heat radiation from the infrared light source unit IRS, the ink can be quickly dried and quickly fixed before it goes overspread into locally uneven distribution. Therefore, the thickness of the hole transporting layer 33a in the color pixels PXr, PXg, and PXb can be made relatively uniform.

As shown in FIG. 3A, in the manufacturing equipment having the above-described printer head, at the step of coating the organic solution (aqueous ink) containing the hole transporting material onto the pixel electrode 32 of each display pixel (color pixel), first, at the first timing, the X-Y dual axial robot 22 is controlled to move the substrate stage 21 such that the respective jetting ports NZL of the ink jetting unit INJ are positioned right above those pixel electrodes 32 that are to be coated with the organic solution HMC (aqueous ink INK) at an i-th order (i being a positive integer). Then, the organic solution HMC (aqueous ink INK) of a predetermined amount, that is turned into liquid drops, is dripped from the plurality of jetting ports NZL formed on the ink jetting unit INJ simultaneously, and coated on the plurality of pixel electrodes 32.

Next, as shown in FIG. 3B, at the second timing, the substrate stage 21 is moved such that the jetting ports NZL of the ink jetting unit INJ are respectively positioned right above the pixel electrodes 32 at an (i+1)th order. Accordingly, the radiating portions APL of the infrared light source IRS (corresponding to the infrared light source unit IRSA in FIG. 3B) that is provided at the back in the scan-moving direction (the direction vertical to the sheet of FIGS. 5A to 5H) of the printer head 11H are positioned right above the pixel electrodes 32 of the i-th order. In this state, infrared light Rir is radiated simultaneously from the radiating portions APL of the infrared light source unit IRS right above the i-th pixel electrodes 32 onto the organic solution HMC coated at the first timing, thereby the solvent in the organic solution HMC is heated and vaporized (dried) and the hole transporting material is fixed on the pixel electrodes 32 as a thin film to form the hole transporting layer 33a.

At this second timing, since the jetting ports NZL of the ink jetting unit INJ are positioned right above the pixel electrodes 32 of the i+1)th order, the operation of dripping and coating the organic solution HMC (aqueous ink INK) is performed onto the pixel electrodes 32 of the i+1)th order likewise at the first timing, in parallel with the operation of radiating the infrared light Rir to dry the organic solution HMC coated on the i-th pixel electrodes 32.

At the second timing described above, the radiation of the infrared light Rir onto the organic solution HMC may be directed only to the region that is coated with the organic solution HMC at the first timing, or may be directed continually to a region (for example, the region surrounded by the partitioning walls 31) that includes the coated region.

By performing the steps of coating and drying the organic solution HMC (aqueous ink INK) containing the hole transporting material onto the pixel forming regions Apx (pixel electrodes 32) while scan-moving the printer head 11 relatively to the panel substrate PSB, it is possible to form the hole transporting layer 33a in the pixel forming region Apx of each display pixel PIX (color pixel PXr, PXg, or PXb) two-dimensionally arrayed on the panel substrate PSB, as shown in FIGS. 4A ad 4B.

The scan-moving manner of the printer head 11H that is relative to the panel substrate PSB (substrate stage 21) adopts, for example, a "switchback path" as shown in FIGS. 6A and 6B, where a going operation of making the printer head 11H scan from one end (the upper end in the diagrams) of the panel substrate PSB to the other end (the lower end in the diagrams), and a returning operation of making the printer head 11H scan from the other end (the lower end in the diagrams) of the panel substrate PSB to the one end (the upper end in the diagrams) are repeated until the entire area of the panel substrate PSB is scanned, while the steps of coating and drying the organic solution HMC (aqueous ink INK) are performed, thereby the hole transporting layer 33a can be formed in all the pixel forming regions Apx on the panel substrate PSB.

In the going operation described above, as shown in FIG. 3A and FIG. 6B, the drying process is performed by the infrared light being radiated from the infrared light source unit IRSA, which is at the back in the scan-moving direction (indicated by an outline arrow in FIG. 6B), onto the organic solution HMC jetted from the ink jetting unit INJ and coated on the pixel electrodes 32. On the other hand, in the returning operation, as shown in FIG. 3C and FIG. 6B, the drying process is performed by the infrared light being radiated form the infrared light source unit IRSB, which is at the back in the scan-moving direction (indicated by an outline arrow in FIG. 6B).

Prior to the step of forming the hole transporting layer 33a (the step of coating the organic solution HMC onto the pixel electrodes 32 in the pixel forming regions Apx), ultraviolet rays may be radiated onto the surface of the panel substrate PSB in, for example, an oxygen gas atmosphere, to generate active oxygen radicals to lyophilicize the surface of the pixel electrodes 32 and also generate radicals on the surface of the partitioning walls 31 to lyophilicize them, and thereafter ultraviolet rays may be radiated onto the panel substrate PSB in, for example, a fluoride gas atmosphere, to make fluorine combine with only the surface of the partitioning walls 31 to impart liquid repellency to them, thereby to form a hydrophilic and hydrophobic pattern where the lyophilicity of the surface of the pixel electrodes 32 is maintained.

With such a treatment, at the steps of coating the organic solution HMC containing the hole transporting material and a later-described organic solution EMC containing an electron-transporting light emitting material, eve if the liquid drops of the organic solution HMC or EMC land on the partitioning walls 31, the liquid drops are repelled because of the liquid repellency of the surface of the partitioning walls 31 and coated only within the pixel forming regions Apx having lyophilicity.

For facilitating understanding, FIGS. 5 and 6 show a case that the organic solution HMC is jetted from the printer head 11H onto three adjoining pixel forming regions Apx simultaneously and coated onto the pixel electrodes 32. The manufacturing equipment and display device manufacturing method according to the present invention are not limited to this case. By appropriately setting the number of jetting ports NZL formed on the ink jetting unit INJ of the printer head 11 shown in FIGS. 2A to 2D and the number of radiating portions APL formed on the infrared light source units IRSA and IRSB respectively, it is possible to coat the organic solution HMC containing the hole transporting material on a larger number of pixel forming regions Apx and form the hole transporting layer 33a therein simultaneously.

Figure 5E:
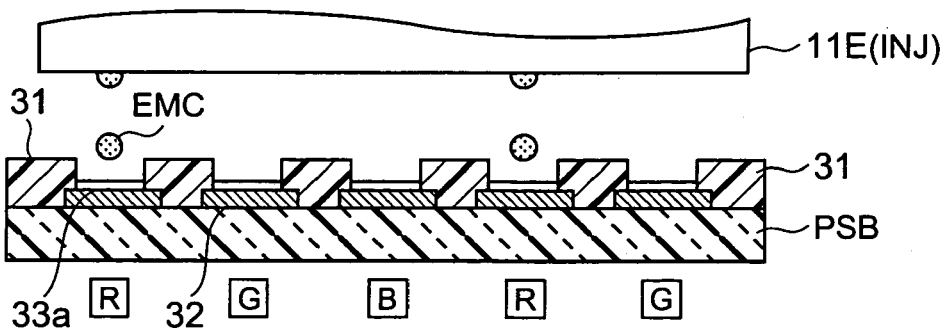

Next, as shown in FIG. 5E, with the use of the display device manufacturing equipment having the above-described structure, an organic solution EMC, which is obtained by adding an organic high-molecular electron-transporting light emitting material (for example, polyphenylenevinylene polymer described above) in a solvent, is turned into liquid drops of a predetermined amount, which is set by the above-described ump unit 12 and pump controlling unit 13, and dripped simultaneously from the ink jetting unit (corresponding to the ink jetting unit INJ described above) of a printer head 11E (having a different structure from the printer head 11H, but an equivalent structure to he printer head 11 described above), to be coated simultaneously on the hole transporting layer 33a, which is formed at the above-described step on the pixel electrode 32 in each pixel forming region Apx.

FIG. 5E shows a case that only in the pixel forming regions of a plurality of color pixels that are for the same color (for example, the pixel forming regions of color pixels PXr for red (R)), among the color pixels PXr, PXg, and PXb for the respective colors included in the display pixels PIX, the organic solution EMC containing the electron-transporting light emitting material that corresponds to that color of light emission is dripped and coated on the hole transporting layer 33a. However, as described above, in a case where, for example, an ink jetting unit INJ, which comprises separate ink storage units that correspond to red (R), green (G), and blue (B) respectively and jetting ports that correspond to the respective colors, is used as the ink jetting unit INJ of the printer head 11E, organic solutions containing electron-transporting light emitting materials that correspond to red (R), green (G), and blue (B) respectively can be simultaneously coated on the regions (pixel forming regions Apx) where color pixels for red (R), green (G), and blue (B) respectively, that are arrayed adjacently, are formed.

Figure 5F:
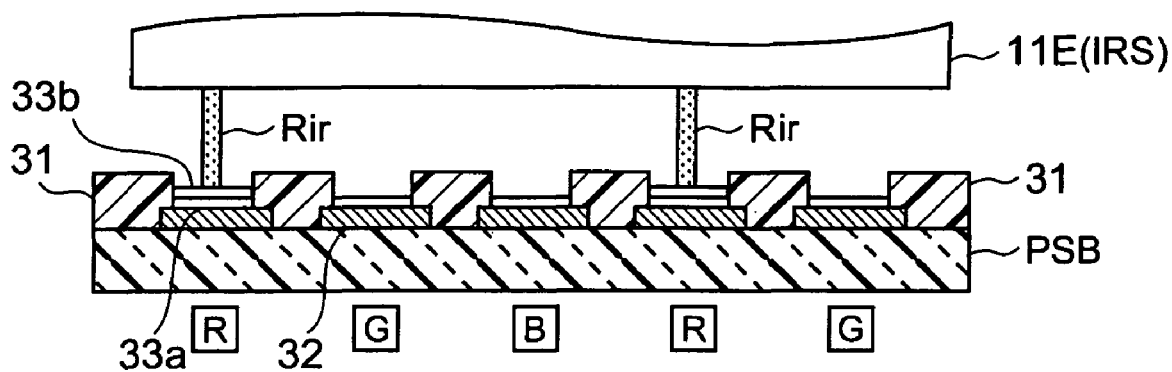

After this, as shown in FIG. 5F, the panel substrate PSB (substrate stage 21) is relatively moved such that the infrared light source unit (corresponding to the above-described infrared light source unit IRSA or IRSB; indicated as "IRS" in the diagram for expediency) of the printer head 11E (printer head 11) is positioned right above the pixel electrodes 32 (hole transporting layers 33a) that are coated with the organic solution EMC, and infrared light Rir is radiated from the infrared light source unit IRS to heat and vaporize the organic solution EMC and fix the electron-transporting light emitting material on the hole transporting layers 33a as a thin film to form an electron-transporting light emitting layer 33b of the organic EL layer 33.

Likewise at the above-described step of hole transporting layers 33a, also at the steps, shown in FIGS. 5E and 5F, of coating the organic solution EMC (organic solvent ink INK) containing the electron-transporting light emitting material on the hole transporting layers 33a of the display pixels PIX (color pixels) and drying the organic solution to form the electron-transporting light emitting layers 33b, it is possible to employ the manner of simultaneously dripping the organic solution EMC of a predetermined amount from each of the plurality of jetting ports NZL provided on the ink jetting unit INJ in the liquid drop form and coat it on the hole transporting layer 33a of each of a plurality of pixel forming regions Apx at the first timing, and then at the second timing, radiating infrared light Rir from each of the plurality of radiating portions APL of the infrared light source unit IRS, which is at the back in the scan-moving direction of the printer head 11E and provided adjacent to the ink jetting unit INJ, and simultaneously irradiating each organic solution EMC coated at the first timing with the infrared light Rir to heat and vaporize (dry) the solvent in the organic solution EMC and form the electron-transporting light emitting layer 33b as a thin film on the hole transporting layers 33a.

By performing the steps of coating the organic solution EMC (organic solvent ink INK) containing the electron-transporting light emitting material on the pixel forming regions Apx and drying the organic solution EMC while scan-moving the printer head 11E to follow a switchback path on the panel substrate PSB likewise as shown in FIGS. 6A and 6B, it is possible to form the electron-transporting light emitting layers 33b on the pixel forming regions Apx of the display pixels PIX (color pixels PXr, PXg, and PXb) arrayed two-dimensionally on the panel substrate PSB, as shown in FIGS. 4A and 4B.

Figure 5G:
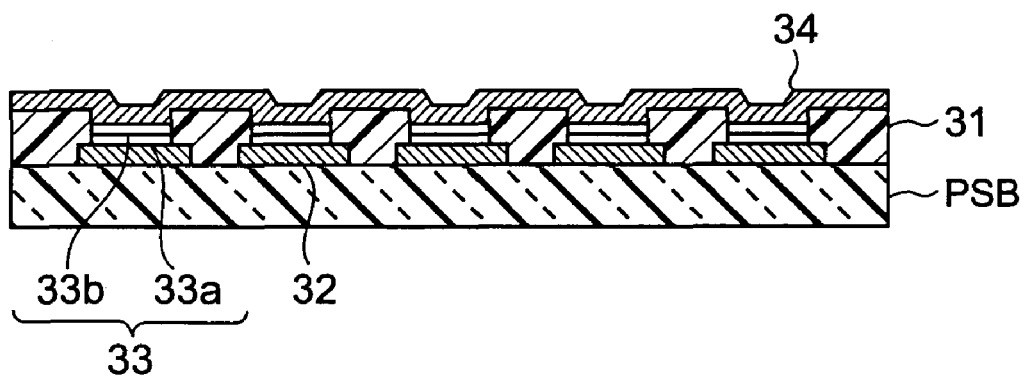
Figure 5H:
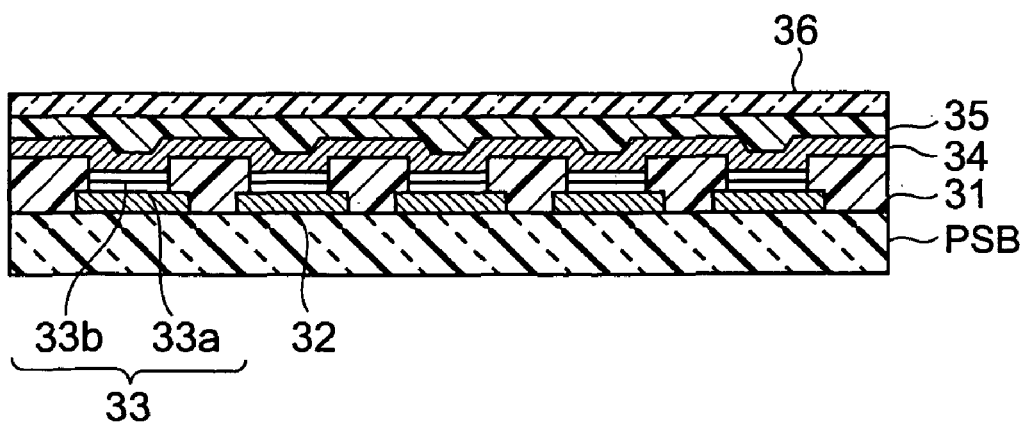

Next, an opposing electrode (for example, a cathode electrode) 34, which faces each pixel electrode 32, is formed integrally in common for the respective pixel forming regions Apx, via at least the organic EL layers comprising the hole transporting layer 33a and the electron-transporting light emitting layer 33b, as shown in FIG. 5G. After this, as shown in FIG. 5H, a protective insulating film and a sealing resin layer 35 are formed on the panel substrate PSB including the opposing electrode 34, and a sealing substrate 36 is further joined, thereby completing the display panel 30, on which the display pixels PIX comprising the organic EL elements are two-dimensionally arrayed.

A specific example of the constitution of the infrared light source and radiation conditions of the infrared light, which are adopted at the above-described steps of forming the organic EL layer (the hole transporting layer 33a and the electron-transporting light emitting layer 33b), will now be shown. Here, a specific example for the step of forming the hole transporting layer 33a will be shown, but the constitution and radiation conditions for the electron-transporting light emitting layer 33b can also be arbitrarily set based on a similar technical idea.

First, an infrared light source may finely be used in the infrared light source units IRSA and IRSB, if it has a wavelength and output level that can heat the organic solution (aqueous ink INK) coated on the panel substrate PSB (pixel electrodes 32) to, for example, about 50° C., though such a temperature requirement is also dependent on the scan-moving speed of the printer head 11. The radiation distance of the infrared light (the distance between the panel substrate PSB and the printer head 11) in this case is dependent on the spot size (the light flux diameter of the infrared light).

Specifically, if it is assumed that the pixel forming region Apx defined by the partitioning walls 31 has, for example, a dimension of 375 μm in the longitudinal direction (the scan-moving direction) and a dimension of 551 μm in the lateral direction (the direction perpendicular to the scan-moving direction), and the height tolerable by the partitioning walls 31 for coating the organic solution HMC (solvent; water) is 200 nm, the volume that can be coated in the region (i.e., the volume of the pixel forming region Apx) is calculated as 375 μm×55 μm×200 nm=4E−15 m$^3$=4 ncc. Since the energy that is required to raise the temperature of water of 1 cc by 1° C. is about 4 J, the heat quantity that is required to raise the temperature of the organic solution (aqueous ink) of this volume by 1° C. is 16 nJ. Accordingly, energy of 640 nJ is required to raise the organic solution having 10° C. when it is coated, to 50° C. (i.e., to raise the temperature by 40° C.).

If it is assumed that the printer head 11 (infrared light source units IRSA and IRSB) is scan-moved over the pixel forming region Apx at a rate of 3m/sec, the time taken to go the dimension of 375 μm of the region in the longitudinal direction (scan-moving direction) is calculated to be 125 μsec. Accordingly, infrared light, which can make energy of 640 nJ÷125 μsec=5 mW be absorbed into the organic solution, should be radiated. Here, in consideration of the optical absorption property (absorption efficiency) of water as the solvent of the organic ink (aqueous ink), a light source of an output level of 50 to 100 mW in case of the wavelength of the infrared light being 1.5 μm, a light source of an output level of 10 mW in case of the wavelength being 4.5 μm, and a light source of an output level of 5 mW in case of the wavelength being 6 μm should be used. In this manner, the output level of the infrared light source units IRSA and IRSB is appropriately set based on the characteristics and amount of the solvent and solute, and further the duration of heating, etc.

In the above-described manufacturing method of the display device (display panel), a case has been explained that the display device manufacturing equipment having the above-described structure is used for both the steps of forming the hole transporting layer 33a and the electron-transporting light emitting layer 33b (FIG. 5C to FIG. 5F) included in the organic EL layer. However, the above-described manufacturing equipment may be used in either one of the steps of forming the hole transporting layer 33a and the electron-transporting light emitting layer 33b.

As described above, according to the present embodiment, at the steps of forming the organic EL layer (for example, the hole transporting layer 33a and the electron-transporting light emitting layer) of each display pixel (each color pixel), it is possible to efficiently heat and dry the organic solution containing the hole transporting material or the organic solution containing the electron-transporting light emitting material by irradiating the organic solution selectively with infrared light immediately after the organic solution is coated, and thereby to fix the hole transporting material or the electron-transporting light emitting material as a thin film.

That is, since the organic solution containing the hole transporting material or the organic solution containing the electron-transporting light emitting material is quickly dried immediately after it is coated, it is possible to prevent the aggregation of the hole transporting material or the electron-transporting light emitting material, which is due to the characteristic (water repellency) of the surface of the partitioning walls, the surface tension and cohesion attributed to the solvent component in the organic solution, the manner of drying the organic solution, etc. as described in the summary of the invention, and to prevent the ends of the liquid surface of the organic solution from being pressed up along the side surfaces of the partitioning walls. This makes it possible to form a hole transporting layer or an electron-transporting light emitting layer whose thickness is uniform over generally the entire area of the pixel forming region Apx. Further, by adopting the above-described step of forming the organic EL layer on the entire area of the display panel, it is possible to form a display panel on which a plurality of display pixels each having an organic EL layer (a hole transporting layer and an electron-transporting light emitting layer) whose thickness is uniform are arrayed two-dimensionally.

Accordingly, since a light emission drive current flows across about the entire area of each pixel forming region Apx uniformly to enable light to be emitted from a wide range of the organic EL layer, and unevenness in the light emitting luminance among the plurality of display pixels arrayed on the display panel is prevented, it is possible to improve the aperture ratio of the display panel and thereby the quality of the displayed image. And since a phenomenon that a large light emission drive current flows through a specific region of each pixel forming region Apx is prevented, it is possible to suppress deterioration of the organic EL layer (organic EL element) and to improve the reliability and longevity of the display panel.

Further, in a case where the panel substrate PSB is totally heated according to prior art, if the printer head 11, which has no heating means, scans as shown in, for example, FIG. 6A, there is a possibility that the time taken to heat the display pixel PIX, in which the organic EL layer 33 is formed first of all, might differ from the time taken to heat the display pixel PIX, in which the organic EL layer 33 is formed last, to result in display pixels PIX with different characteristics. However, according to the above-described embodiment, the display pixels PIX can be heated uniformly because the time to heat the display pixels PIX is even.

In the above-described embodiment, a case has been explained that the constitution of the printer head 11 is such that a pair of infrared light source unit IRSA and IRSB are provided so as to sandwich the ink jetting unit INJ and the driving of each infrared light source unit is controlled based on a control signal from the light source controlling unit 15. The present invention is not limited to this case. For example, the infrared light source units may be provided externally on the printer head and infrared light from the light sources may be supplied (guided) to the printer head through a fiber optic line, etc. Further, the infrared light may be radiated on the panel substrate through an optical member such as a reflecting mirror, etc. provided on the printer head.

Figure 7A:
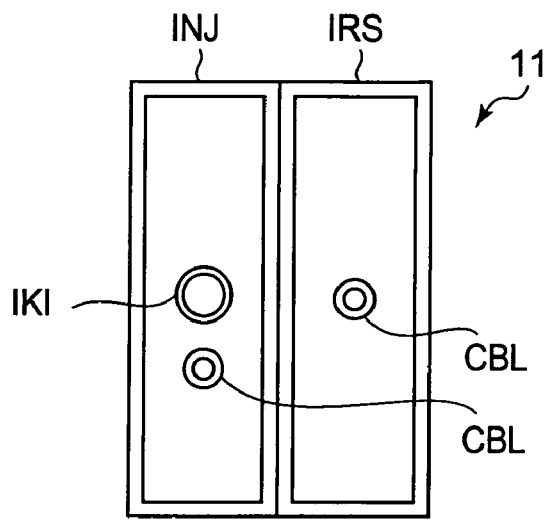
FIGS. 7A to 7D are schematic structure diagrams showing another example of the printer head to be used in the display device manufacturing equipment according to the present embodiment.
Figure 7B:
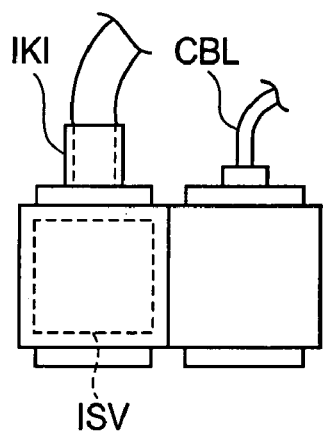
Figure 7C:
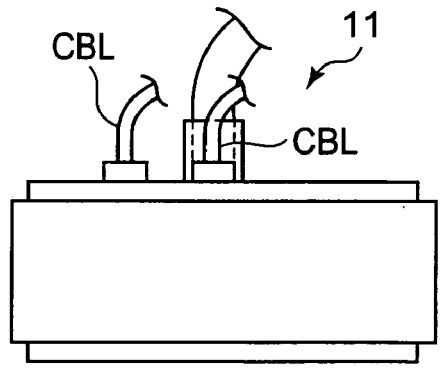
Figure 7D:
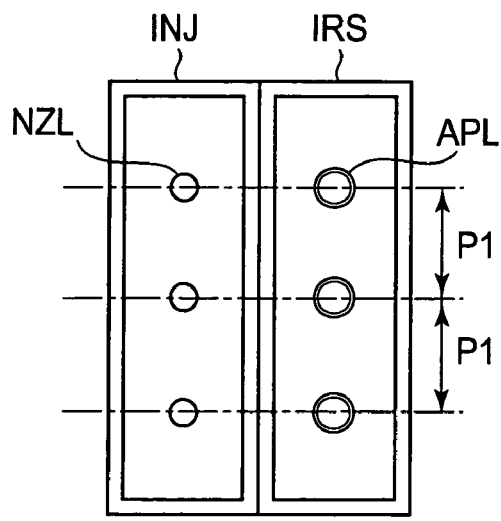
Figure 8A:
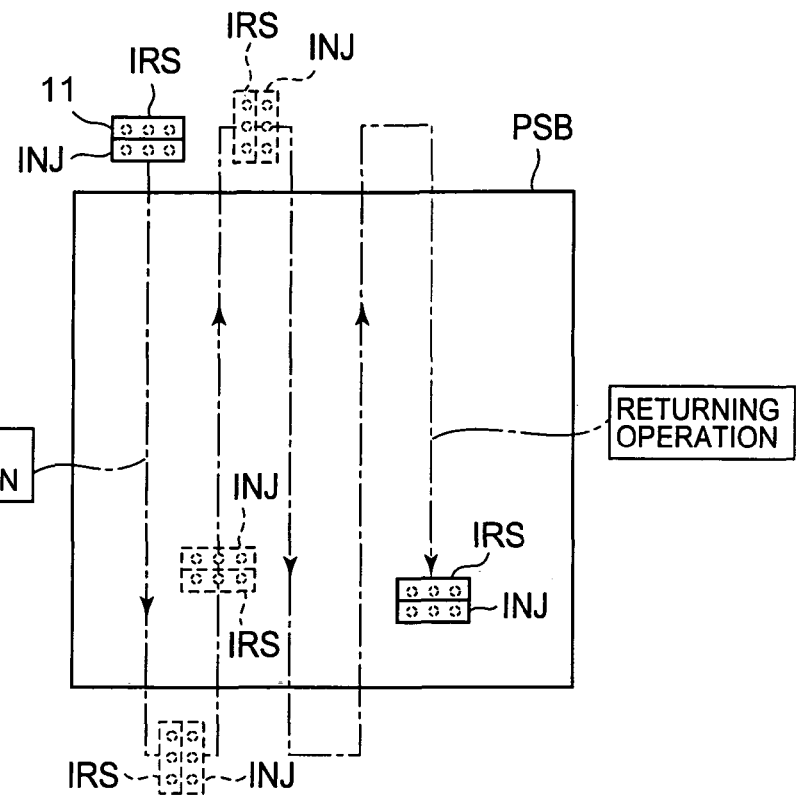
FIGS. 8A and 8B are conceptual diagrams for explaining the scan-moving path of the printer head over a panel substrate (substrate stage), according to the manufacturing equipment comprising the printer head of the present example.
Figure 8B:
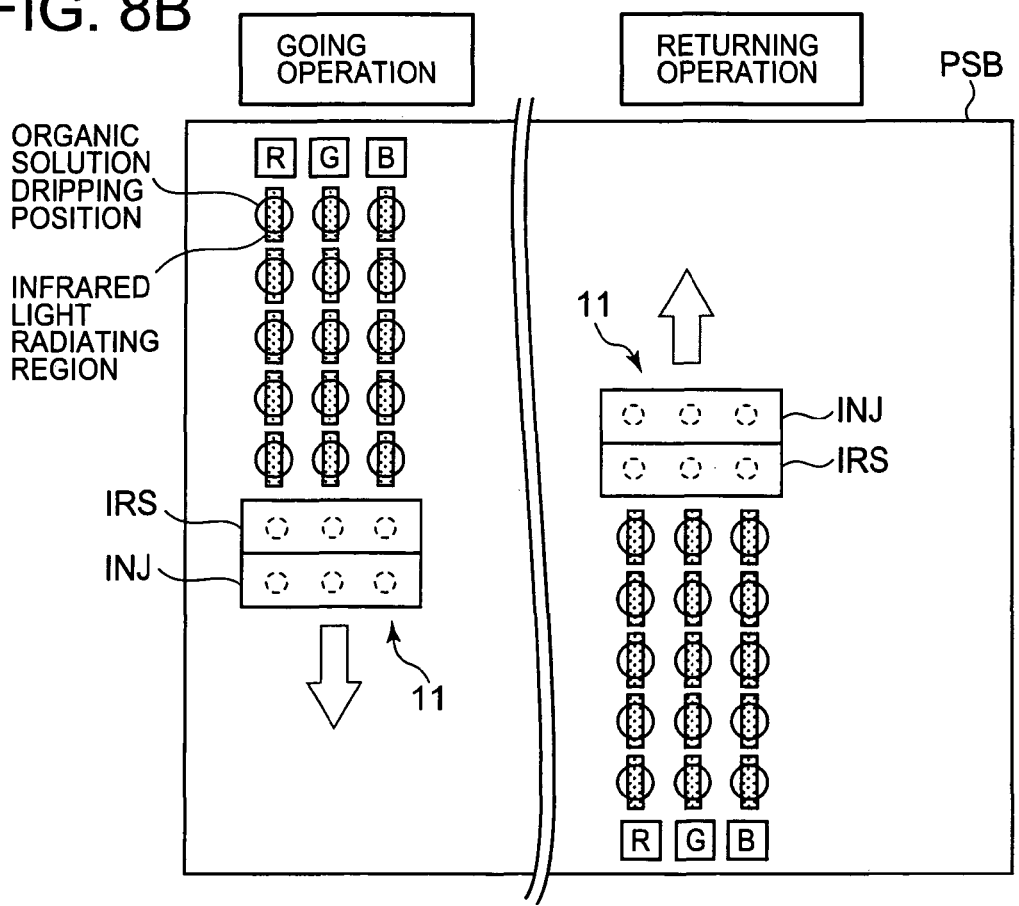
Figure 9A:
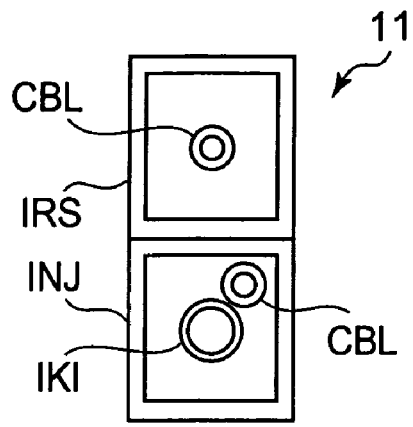
FIGS. 9A to 9D are schematic structure diagrams showing an example of a printer head to be used in a display device manufacturing equipment according to a second embodiment.
Figure 9B:
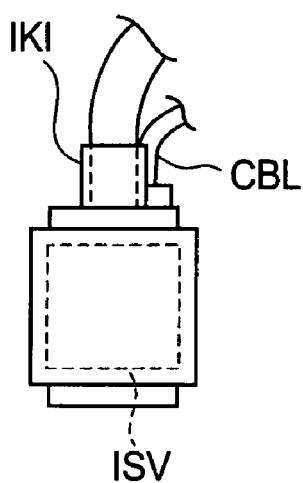
Figure 9C:
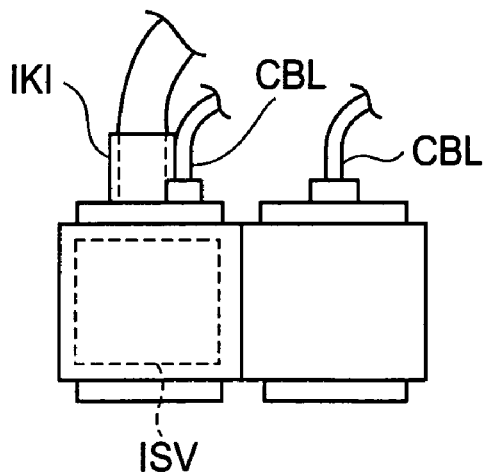
Figure 9D:
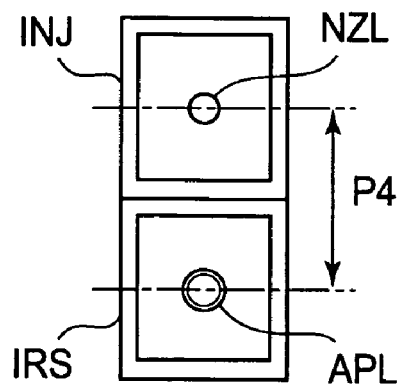

FIGS. 7A to 7D are schematic structure diagrams showing another example of the printer head to be used in the display device manufacturing equipment according to the present embodiment. FIG. 7A is a plan view (top view) of the printer head. FIG. 7B is a front elevation of the printer head. FIG. 7C is a side elevation of the printer head. FIG. 7D is a bottom view (nozzle surface view) of the printer head. Components that are the same as those of the printer head shown in FIGS. 2 will be explained while denoted by the same reference numerals. FIGS. 8A and 8B are conceptual diagrams for explaining the scan-moving path of the printer head with respect to the pane substrate (substrate stage), according to the manufacturing equipment comprising the printer head according to the present example.

Though the printer head shown in FIGS. 2A to 2D has a structure that the pair of infrared light source units IRSA and IRSB are provided adjacently to sandwich the ink jetting unit INJ therebetween, the printer head 11 according to the present example has only one infrared light source unit IRS that is adjacent to the ink jetting unit INJ and at the back in the scan-moving direction of the printer head 11, as shown in FIGS. 7 and 8.

According to a manufacturing method using a manufacturing equipment comprising the printer head 11 having such a structure, if the scan-moving manner of the printer head 11 relative to the panel substrate PSB (substrate stage 21) is to move the printer head 11 so as to go a "switchback path" with respect to the panel substrate PSB as shown in FIGS. 8A and 8B, the printer head 11 is rotated by 180° in the returning operation such that the ink jetting unit INJ is always at the front in the scan-moving direction (indicated by outline arrows in FIG. 8B) of the printer head 11 while the infrared light source unit IRS is always at the back. By this setting, it is possible to form an organic EL layer having a uniform thickness, by utilizing a manufacturing method (steps of forming a hole transporting layer and an electron-transporting light emitting layer) similar to the above-described embodiment, while using a printer head with a simple structure.

Second Embodiment

Figure 10A:
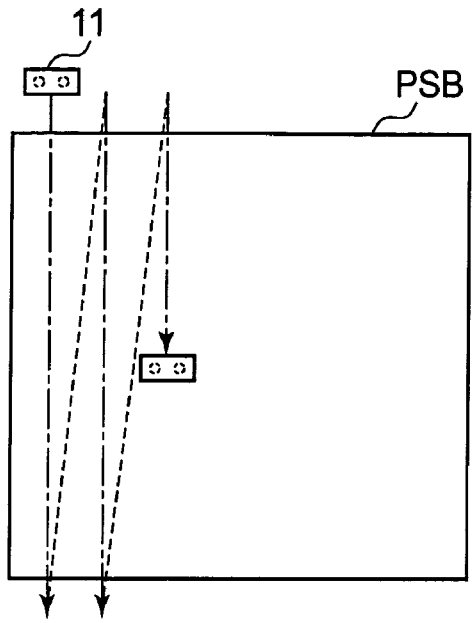
FIGS. 10A to 10C are conceptual diagrams for explaining an example of the scan-moving path of the printer head over a panel substrate (substrate stage), according to the manufacturing equipment comprising the printer head of the present embodiment.
Figure 10B:
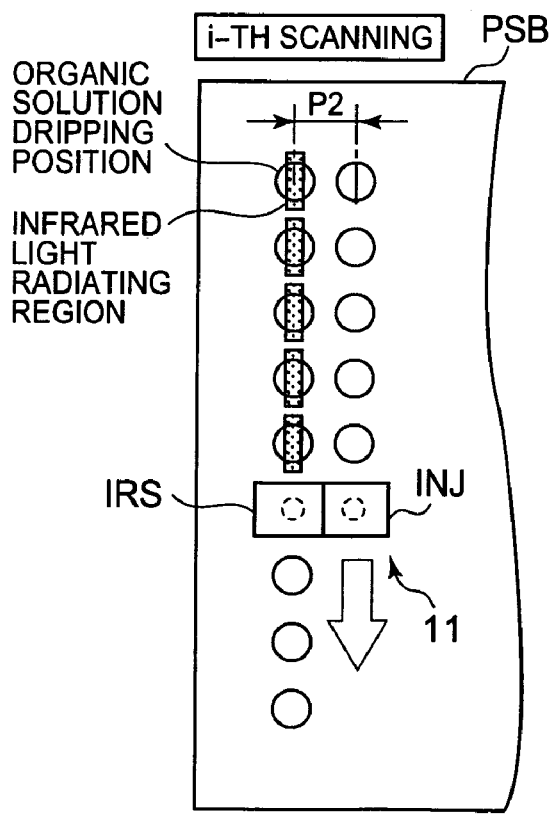
Figure 10C:
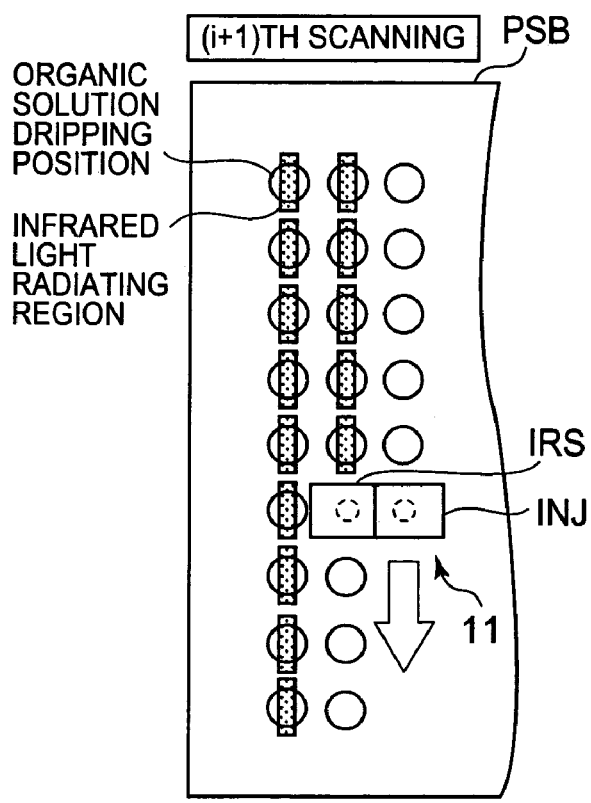
Figure 11A:
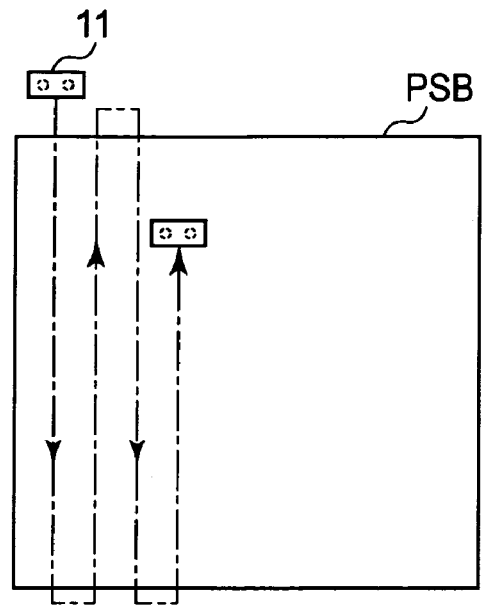
FIGS. 11A to 11C are conceptual diagrams for explaining another example of the scan-moving path of the printer head over a panel substrate (substrate stage), according to the manufacturing equipment comprising the printer head of the present embodiment.
Figure 11B:
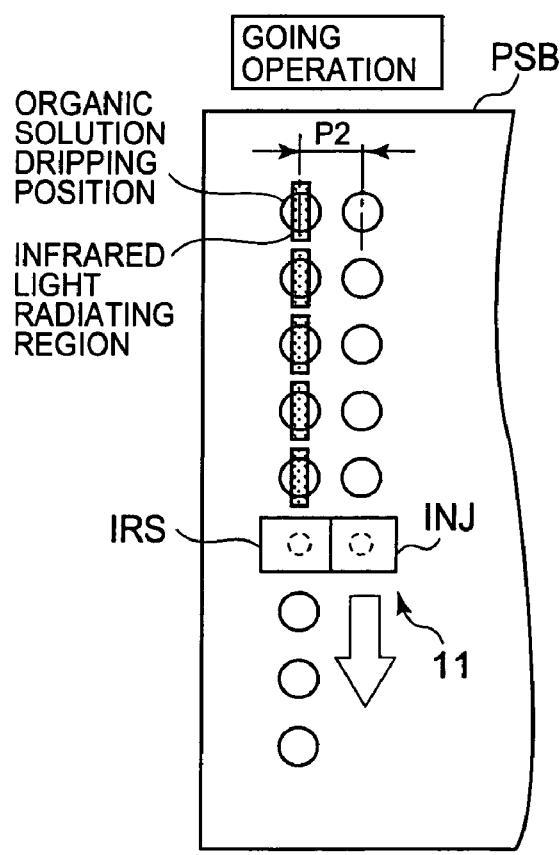
Figure 11C:
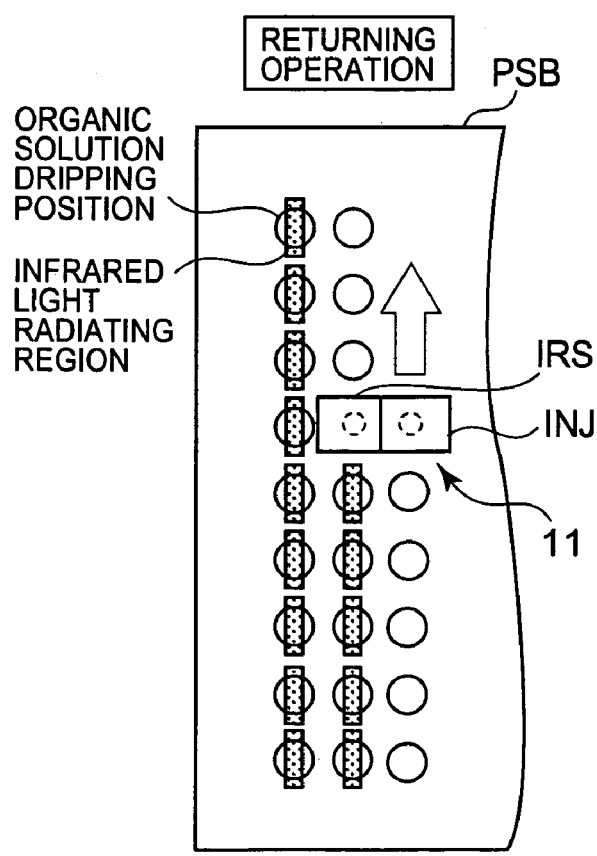

FIGS. 9A to 9D are schematic structure diagrams showing an example of a printer head to be used in a display device manufacturing equipment according to the second embodiment. The overall structure of the display device manufacturing equipment is similar to that of the first embodiment (see FIGS. 1A and 1B), and a detailed explanation of the structure will thus be omitted. Any components that are similar to those of the printer head shown in FIGS. 2 and 7 will be explained while denoted by the same reference numerals. FIGS. 10A to 10C are conceptual diagrams for explaining an example of the scan-moving path of the printer head with respect to the panel substrate (substrate stage), in the manufacturing equipment comprising the printer head according to the present embodiment. FIGS. 11A to 11C are conceptual diagrams for explaining another example of the scan-moving path of the printer head with respect to the panel substrate (substrate stage), in the manufacturing equipment comprising the printer head according to the present embodiment.

The printer head 11 (see FIGS. 2 and 7) shown in the first embodiment has a structure that the jetting ports NZL of the ink jetting unit INJ and the radiating portions APL of the infrared light source unit(s) IRS (IRSA and IRSB) are arranged on scan-moving direction lines (indicated by dashed-dotted lines of FIGS. 2D and 7D) correspondingly. According to the present embodiment, as shown in FIGS. 9 and 10, the printer head 11 on which the ink jetting unit INJ and the infrared light source unit IRS are integrally formed adjacently to each other has the jetting port INJ of the ink jetting unit INJ and the radiating portion APL of the infrared light source unit IRS arrayed in a direction perpendicular to the scan-moving direction (indicated by dashed-dotted lines in FIG. 9D, and by outline arrows in FIGS. 10B and 10C).

According to a manufacturing method utilizing the manufacturing equipment comprising the printer head 11 having such a structure, if the scan-moving manner of the printer head 11 with respect to the panel substrate PSB (substrate stage 21) is to repeat "unidirectional scanning" of scan-moving the printer head 11 from one end (the upper end in the diagram) of the panel substrate PSB to the other end (the lower end in the diagram) as shown in, for example, FIGS. 10A to 10C, the organic solution that has been coated on the panel substrate PSB by the ink jetting unit INJ of the printer head 11 in the previous unidirectional scanning (i-th scanning) is irradiated with infrared light to be dried by the infrared light source unit IRS of the printer head 11 in the next unidirectional scanning ((i+1)th scanning) as shown in FIGS. 10B and 10C, to fix the hole transporting material or the electron-transporting light emitting material contained in the organic solution on the panel substrate PSB.

As another example of the scan-moving manner of the printer head 11 having such a structure, the printer head 11 may be moved to follow a "switchback path" with respect to the panel substrate PSB as shown in, for example, FIGS. 11A to 11C. In this case, as shown in FIGS. 11B and 11C, the organic solution that has been coated on the panel substrate PSB by the ink jetting unit INJ of the printer head 11 in the going operation (previous scanning) is irradiated with infrared light to be dried by the infrared light source unit IRS of the printer head 11 in the returning operation (next scanning), to fix the hole transporting material or the electron-transporting light emitting material contained in the organic solution on the panel substrate PSB.

That is, in the printer head 11 according to the present embodiment, the arrangement interval P4 between the jetting port NZL formed on the ink jetting unit INJ and the irradiating portion APL formed on the infrared light source unit IRS is set so as to correspond to the arrangement interval (the interval between adjoining display pixels on the panel substrate PSB shown in FIG. 10B and FIG. 11B, equivalent to the arrangement interval between color pixels shown in FIGS. 4A and 4B) P2 between adjoining pixel forming regions arrayed two-dimensionally on the panel substrate PSB (P4=P2).

Therefore, at the step of the printer head 11 scanning the panel substrate PSB and coating the organic solution, the operation (coating operation) by the ink jetting unit INJ for jetting and coating the organic solution and the operation (drying operation) by the infrared light source unit IRS for radiating infrared light to the coated organic solution to dry the organic solution can be performed simultaneously in parallel. Therefore, an organic EL layer having a uniform thickness can be formed likewise in the above-described first embodiment.

In each of the above-described embodiments, the printer head 11 is structured such that the ink jetting unit INJ and the infrared light source unit are formed integrally with each other. The present invention is not limited to this, but the ink jetting unit INJ and the infrared light source unit may be formed separately. In this case, such a structure can be adopted in which the jetting ports NZL of the ink jetting unit INJ and the radiating portions APL of the infrared light source unit are at an arrangement interval that is the same as or an integer multiple of the arrangement interval between the display pixels (color pixels) arrayed adjacently to each other on the panel substrate PSB (display panel 30).

In each of the above-described embodiments, the method of radiating infrared light to the organic solution coated on the panel substrate PSB immediately after it is coated to heat and dry the organic solution has been shown. However, the present invention is not limited to this. With the use of, for example, the printer head 11 shown in the first embodiment, infrared light may be radiated to the pixel forming regions from the infrared light source unit that is arranged at the front in the scan-moving direction of the ink jetting unit INJ, immediately before the organic solution is coated (or preliminarily) to coat the organic solution in a state that the pixel forming regions are heated (preheated). In addition, after the organic solution is coated, infrared light may be radiated to the organic solution from the infrared light source unit that is arranged at the back in the scan-moving direction of the ink jetting unit INJ. Also according to this method, the organic solution coated on the pixel forming regions is quickly heated and dried. Thus, an organic EL layer having a uniform thickness can be formed, likewise in the above-described embodiments.

In each of the above-described embodiments, the method of radiating infrared light to the organic solution coated on the panel substrate PSB to heat and dry only the organic solution has been shown. However, the present invention is not limited to this. For example, a plurality of radiating portions APL for radiating infrared lights (for example, first and second infrared lights) may be prepared on the infrared light source unit for each jetting port NZL on the ink jetting unit INJ of the printer head 11, so that the first infrared light may be radiated to the organic solution coated on the panel substrate PSB locally about the center region (of the pixel forming regions) to heat this region to a specific temperature (for example, a first temperature) and the second infrared light may be simultaneously radiated to the partitioning walls 31 that define the pixel forming regions coated with the organic solution to heat the partitioning walls 31 to a second temperature higher than the first temperature. This produces a temperature difference in each pixel forming region coated with the organic solution, and puts the region near the partitioning walls 31 at a higher temperature than the center region of the pixel forming regions to promote quicker vaporizing and drying of the solvent in the region near the partitioning walls 31. Therefore, an organic EL layer having a uniform thickness can be formed likewise in the above-described embodiments.

In each of the above-described embodiments, the organic EL layer 33 comprises the hole transporting layer 33a and the electron-transporting light emitting layer 33b. This is not the only case, but the organic EL layer 33 may comprise only a dual-functional hole-transporting/electron-transporting light emitting layer, or comprise a hole-transporting light emitting layer and an electron transporting layer, or arbitrarily comprise a charge transporting layer in-between.

In each of the above-described embodiments, the structure for radiating infrared light has been shown as a method for heating and drying the organic solution coated on the panel substrate PSB. However, the present invention is not limited to this. Any structure that can process heating and drying in a similar state to those in the above-described case of radiating infrared light, i.e., any structure that can locally heat and dry the organic solution coated on the panel substrate PSB can be employed. Therefore, a structure provided with another heat source (heater, etc.) in the printer head 11, such as hot air heated to a predetermined temperature, may be employed.

The present invention can not only be applied to an ink jetting device for jetting the organic solution in the liquid drop form, but to a nozzle printing device or the like for dripping a continual flow of organic solution. In this case, the organic solution (aqueous ink or organic solvent ink) for forming the organic EL layer is continually jetted in the liquid form from the ink jetting unit INJ to be coated on the plurality of pixel forming regions on the panel substrate PSB. Therefore, by radiating infrared light from the infrared light source unit (or by supplying thermal energy from a heat source) continually to the coated organic solution to heat and dry the organic solution, it is possible to fix the hole transporting material or the electron-transporting light emitting material as a thin film on and between the plurality of pixel forming Apx on the panel substrate PSB.

Figure 12A:
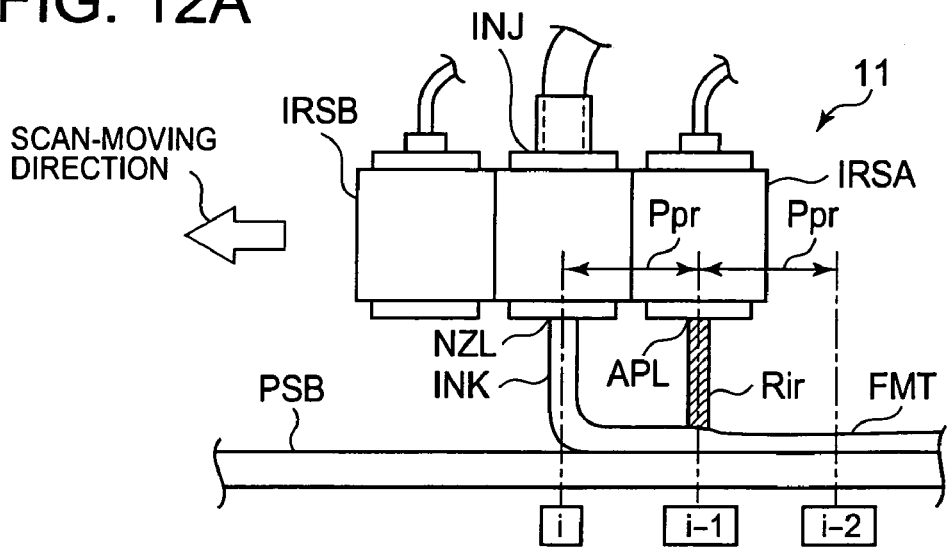
FIGS. 12A to 12C are conceptual diagrams for explaining an operation of coating an aqueous ink or an organic solvent ink and an operation of drying the ink, with the use of a printer head for a nozzle printer, which is to be used in the display device manufacturing equipment according to the embodiments of the present invention.
Figure 12B:
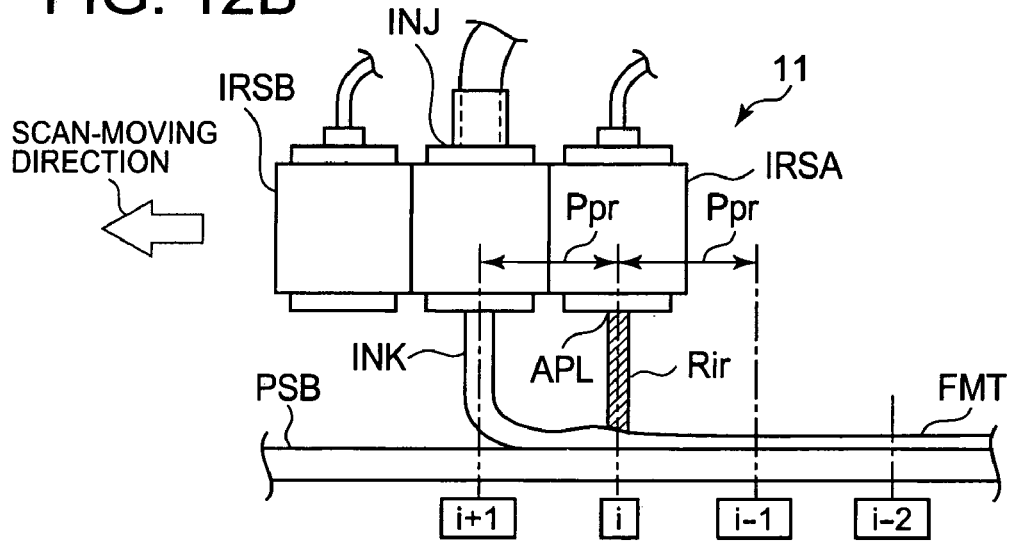
Figure 12C:
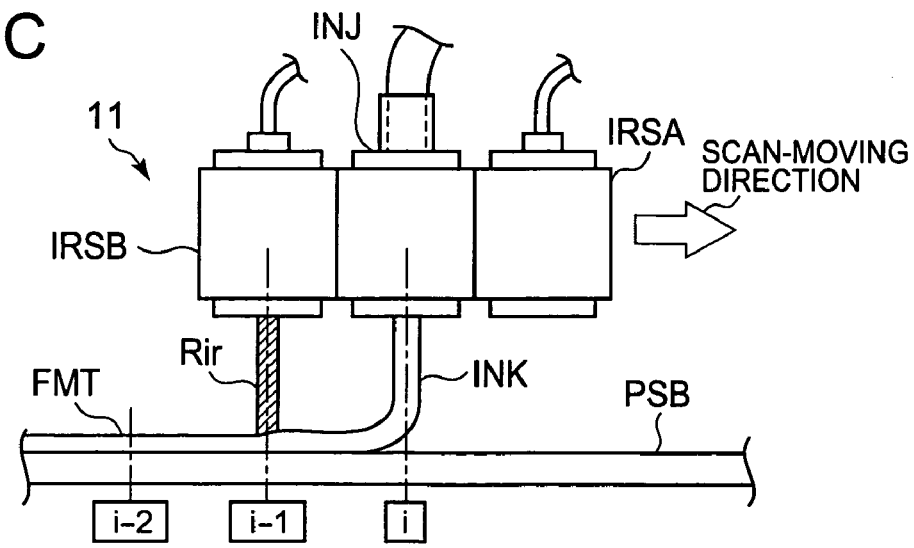

FIGS. 12A to 12C are conceptual diagrams for explaining an operation of dripping an aqueous ink or an organic solvent ink and an operation of drying the ink, with the use of a nozzle printer head, which is to be used in the display device manufacturing equipment according to an embodiment of the present invention.

In the present display device manufacturing equipment, the ink jetting unit INJ of the nozzle printer head 11 moves in the scan-moving direction and continually drips the aqueous ink or the organic solvent ink onto the pixel forming regions Apx on the panel substrate PSB, and the dripped aqueous ink or organic solvent ink immediately spreads over the pixel forming regions Apx. Then, of the infrared light source units IRSA and IRSB provided adjacently to the ink jetting unit INJ, the one that is positioned at the back in the scan-moving direction continually radiates infrared light while moving in the scan-moving direction. Therefore, the infrared light heats the aqueous ink or the organic solvent ink spread over the pixel forming regions Apx when passing above these regions, and the solvent in the aqueous ink or the organic solvent ink is vaporized and dried to fix the charge transporting material such as the hole-transporting material, the electron-transporting material, or the like on the panel substrate PSB.

Specifically, as shown in FIGS. 12A and 12B, in a case where the operation of dripping the aqueous ink or the organic solvent ink and the operation of drying the ink are performed by scan-moving the nozzle printer head 11 over the panel substrate PSB from the right in the diagram to the left in the diagram (as indicated by an outline arrow in the diagrams), first, at the above-described first timing, the aqueous ink or the organic solvent ink INK is jetted from the jetting ports NZL of the ink jetting unit INJ in the state that the jetting ports NZL are positioned above desired pixel forming regions Apx (specifically, right above the pixel electrodes 32 of the organic EL elements) and continually dripped on the surface of the panel substrate PSB, as shown in FIG. 12A.

Then, at the second timing, as shown in FIG. 12B, the nozzle printer head 11 is moved relatively to the panel substrate PSB (substrate stage 21) by a distance that corresponds to the interval Ppr between the center of the jetting port NZL of the ink jetting unit INJ and the center of the infrared light radiating portion APL of the infrared light source unit IRSA formed adjacently to and integrally with the ink jetting unit INJ, and infrared light Rir is radiated to the aqueous ink or the organic solvent ink INK dripped at the first timing from the infrared light source unit IRSA formed adjacently at the right of the ink jetting unit INJ to heat and vaporize the solvent in the aqueous ink or the organic solvent ink INK and fix the hole transporting material or the electron transporting material dissolved in the aqueous ink or the organic solvent ink INK to form a hole transporting layer or an electron-transporting light emitting layer made of an organic thin film FMT.

On the other hand, as shown in FIG. 12C, in a case where the operation of dripping the aqueous ink or the organic solvent ink INK and the operation of drying the ink are performed by scan-moving the nozzle printer head 11 over the panel substrate PSB from the left in the diagram to the right in the diagram (as indicated by an outline arrow in the diagram), infrared light Rir is radiated at the second timing from the infrared light source unit IRSB formed adjacently to the ink jetting unit INJ at the left side thereof onto the aqueous ink or the organic solvent ink INK coated at the first timing, to heat and vaporize the solvent in the aqueous ink or the organic solvent ink INK and fix the hole transporting material or the electron transporting material on the pixel forming regions Apx.

Figure 13A:
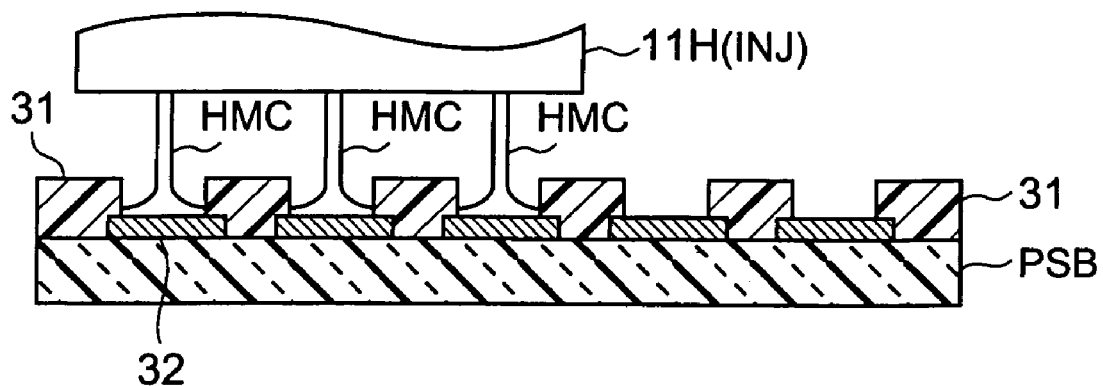
FIGS. 13A to 13C are cross sectional diagrams of manufacturing steps showing an example of a manufacturing method of a display device (display panel), utilizing a manufacturing equipment in which the printer head for the nozzle printer shown in FIGS. 12A to 12C is used.
Figure 13B:
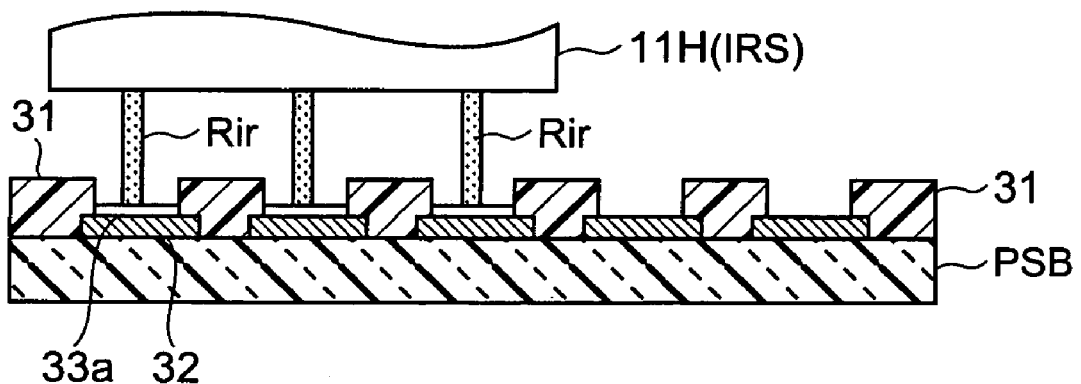
Figure 13C:
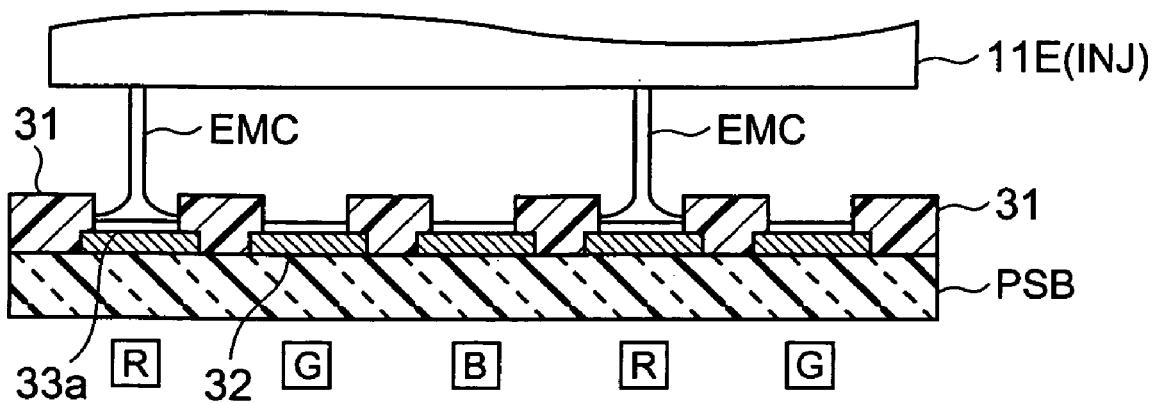
Figure 14A:
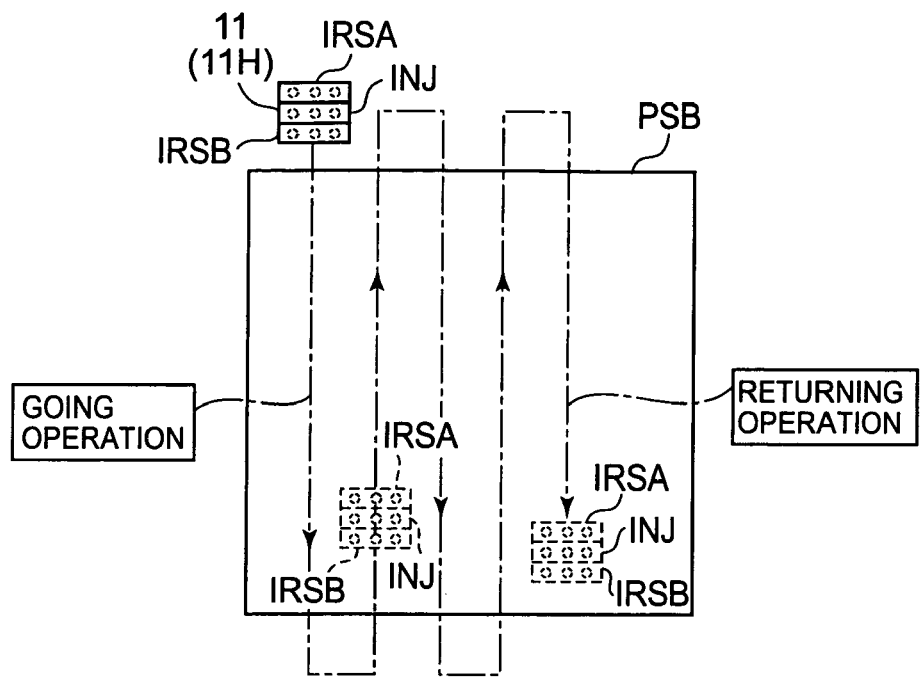
FIGS. 14A and 14B are conceptual diagrams for explaining the scan-moving path of the printer head over a panel substrate (substrate stage), according the manufacturing equipment in which the printer head for the nozzle printer is used.
Figure 14B:
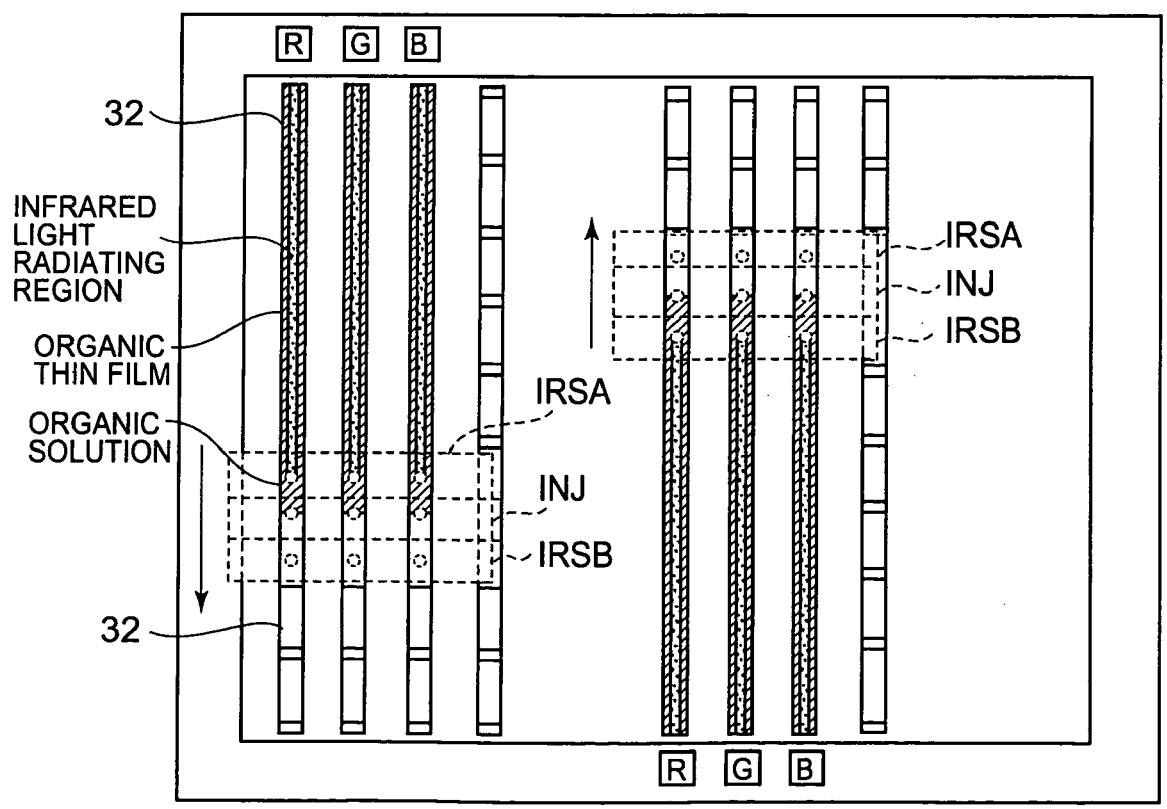
Figure 15:
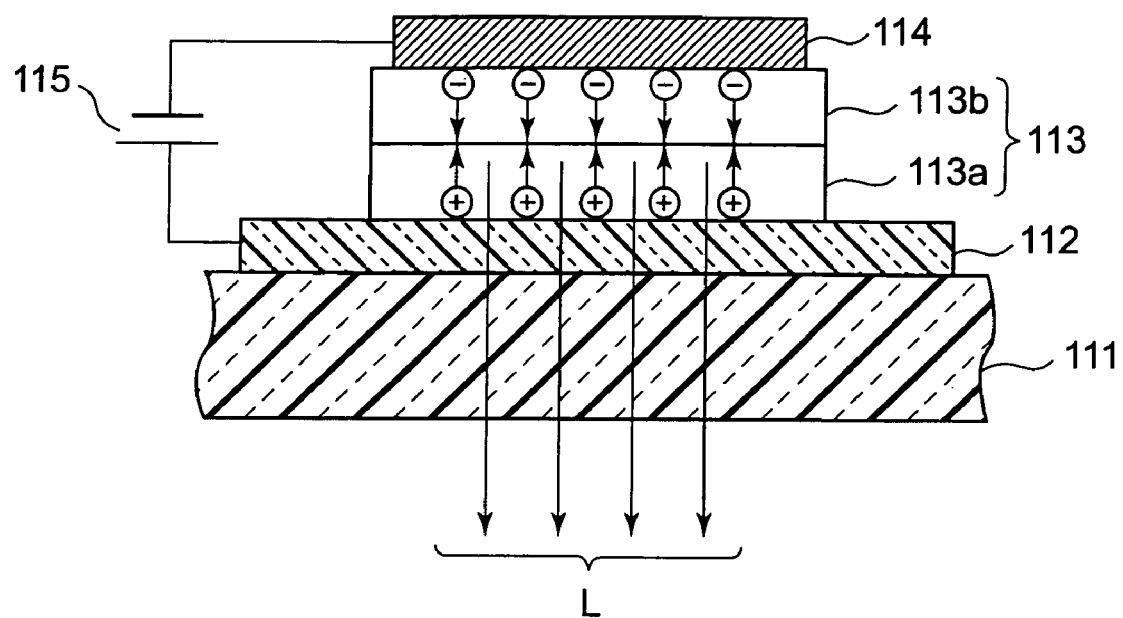
FIG. 15 is a schematic cross sectional diagram showing a basic structure of an organic EL element.

FIGS. 13A to 13C are cross sectional diagrams of manufacturing steps showing an example of a manufacturing method of a display device (display panel) with the use of a manufacturing equipment using a nozzle printer head. Here, a case will be explained that a color display panel comprising display pixels PIX each made up of a group of color pixels PXr, PXg, and PXb having three colors of red (R), green (G), and blue (B) respectively which are shown in FIGS. 4A and 4B is to be manufactured. And reference will appropriately be made to the above-described explanation of the nozzle printer head 11 (FIGS. 12A to 12C), regarding the step of coating the aqueous ink or the organic solvent ink INK to each color pixel. FIGS. 14A and 14B are conceptual diagrams for explaining the scan-moving path of the nozzle printer head 11 over the panel substrate PSB (substrate stage 21), according to the manufacturing equipment of the present embodiment.

With the use of the display device manufacturing equipment having the above-described structure, an organic solution (material solution; aqueous ink) HMC, which is obtained by adding a hole transporting material (for example, PEDOT/PSS described above) in an aqueous solvent (for example, water of 99 to 80 wt % and ethanol of 1 to 20 wt %), is turned into liquid drops of a predetermined amount set by the above-described pump unit 12 and pump controlling unit 13 and dripped from the ink jetting unit (corresponding to the ink jetting unit INJ described above) of a nozzle printer head 11H (having an equivalent structure to the nozzle printer head 11 described above) to be coated on the pixel electrode 21 of each pixel forming region Apx, as shown in FIG. 13A. The organic solution HMC is continually dripped without being intermitted at the region between the pixel electrodes 32 arrayed in the longitudinal direction.

After this, as shown in FIG. 13B, the panel substrate PSB (substrate stage 21) is relatively moved such that the infrared light source unit (corresponding to the infrared light source unit IRSA or IRSB described above; indicated as "IRS" in the diagram for expediency) of the nozzle printer head 11H (nozzle printer head 11) is positioned right above the pixel electrodes 32 coated with the organic solution HMC, and infrared light Rir is radiated from the infrared light source unit IRS to heat and vaporize the organic solution HMC and fix the hole transporting material as a thin film on the pixel electrodes 32 to form the hole transporting layer 33a of the organic EL layer 33. The infrared light Rir is continually radiated without being intermitted at the region between the pixel electrodes 32 arrayed in the longitudinal direction.

Then, as shown in FIG. 13C, with the use of the display device manufacturing equipment having the above-described structure, an organic solution EMC, which is obtained by adding an organic high-molecular electron-transporting light emitting material (for example, polyphenylenevinylene polymer described above) in a solvent, is turned into liquid drops of a predetermined amount set by the above-described pump unit 12 and pump controlling unit 13 and simultaneously dripped from the ink jetting unit (corresponding to the ink jetting unit INJ described above) of a nozzle printer head 11E (having a different structure from the nozzle printer head 11H but having an equivalent structure to the nozzle printer head 11 described above), to be simultaneously coated on the hole transporting layer 33a formed at the above-described step on the pixel electrode 32 of each pixel forming region Apx.

A case is shown here that only in the pixel forming regions of a plurality of color pixels that are for the same color (for example, the regions in which color pixels PXr for red (R) are to be formed), among the color pixels PXr, PXg, and PXb for the respective colors included in the display pixels PIX, the organic solution EMC containing an electron-transporting light emitting material corresponding to that color of light emission is dripped and coated on the hole transporting layer 33a. However, as described above, in a case where, for example, an ink jetting unit INJ, which comprises separate ink storage units ISV that correspond to red (R), green (G), and blue (B) respectively and jetting ports that correspond to the respective colors, is used as the ink jetting unit INJ of the printer head 11E, organic solutions containing electron-transporting light emitting materials that correspond to the respective colors of light emission of red (R), green (G), and blue (B) can be simultaneously coated on the regions (pixel forming regions Apx) where color pixels for red (R), green (G), and blue (B) respectively, that are arrayed adjacently, are formed.

FIGS. 14A and 14B are conceptual diagrams for explaining the scan-moving path of the nozzle printer head 11 over the panel substrate PSB (substrate stage 21), according to the manufacturing equipment of the present embodiment. It is possible to form the hole transporting layer 33a on all the pixel forming regions Apx on the panel substrate PSB, by performing the step of coating the organic solution (aqueous ink) HMC and the step of drying the ink while moving the nozzle printer head 11 to follow a "switchback path" in which a going operation of scanning the panel substrate PSB from one end (the upper end in the diagram) to the other end (the lower end in the diagram) and a returning operation of scanning the panel substrate PSB from the other end (the lower end in the diagram) to the one end (the upper end in the diagram) are repeated until the entire area of the panel substrate PSB is scanned.

In the going operation, as shown in FIG. 14B, infrared light is radiated from the infrared light source unit IRSA that is at the back in the scan-moving direction (indicated by an arrow in FIG. 14B) to dry the organic solution HMC jetted from the ink jetting unit INJ and coated on the pixel electrodes 32. On the other hand, in the returning operation, as shown in FIG. 14B, infrared light is radiated from the infrared light source unit IRSB that is at the back in the scan-moving direction (indicated by an arrow in FIG. 14B) to perform drying.

The manufacturing equipment using the nozzle printer head and the operation method of the equipment can be applied not only to the above-described embodiment but also to those shown in FIGS. 7 to 11.

The infrared light radiated from the infrared light source unit may be irradiated on the entire region of spread of the aqueous ink or the organic solvent ink INK that is coated, or may be irradiated on at least the region to be the light emitting region within each pixel forming region.

In each of the above-described embodiments, instant heating and drying by the infrared radiation is intended. However, depending on the film forming conditions, complete instant drying is not indispensable.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2005-370617 filed on Dec. 22, 2005 and including specification, claims, drawings and summary. The disclosure of the above Japanese Patent Application is incorporated herein by reference in its entirety.

What is claimed is:

1. A manufacturing method of a display device having a display panel on which a plurality of display pixels are arrayed, the method using equipment including a printer head which comprises a solution jetting unit having a nozzle for jetting a material solution and coating it on regions where the display pixels are to be formed, and a solution heating unit disposed adjacent to the solution jetting unit for heating and drying the material solution coated on the regions where the display pixels are to be formed, wherein the solution heating unit and the solution jetting unit are arranged in a direction perpendicular to a relative scan-moving direction of the printer head, the method comprising:

a step of heating and drying the material solution, in which while the nozzle of the solution jetting unit is coating on a first column of the regions where the display pixels are to be formed, the solution heating unit heats and dries the material solution coated by the nozzle of the solution jetting unit on a second column of the regions where the display pixels are to be formed, wherein the material solution on the second column has been coated before the material solution on the first column is coated, and the first and second columns run along the scan-moving direction on the display panel.

2. The manufacturing method of the display device according to claim 1, wherein in the step of heating and drying the material solution, infrared light is radiated to the material solution coated on the regions, where the display pixels are to be formed, to heat and dry the material solution.

3. The manufacturing method of the display device according to claim 1, wherein the material solution is coated on the second column during relative movement of the printer head and the display panel in a first direction, and the material solution is coated on the first column during relative movement of the printer head and the display panel in a second direction that is opposite to the first direction.

4. The manufacturing method of the display device according to claim 1, wherein the second column is adjacent to the first column.

* * * * *